(12) United States Patent
Nakatsu et al.

(10) Patent No.: US 8,373,300 B2
(45) Date of Patent: Feb. 12, 2013

(54) POWER CONVERSION APPARATUS AND ELECTRIC VEHICLE

(75) Inventors: Kinya Nakatsu, Hitachinaka (JP); Hideyo Suzuki, Hitachinaka (JP); Fusanori Nishikimi, Hitachinaka (JP); Takeshi Matsuo, Hitachinaka (JP); Atsushi Yukita, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/445,181

(22) Filed: Apr. 12, 2012

(65) Prior Publication Data

US 2012/0200164 A1    Aug. 9, 2012

Related U.S. Application Data

(63) Continuation of application No. 12/472,126, filed on May 26, 2009.

(30) Foreign Application Priority Data

Jul. 29, 2008    (JP) ................................. 2008-195339

(51) Int. Cl.
*H02G 3/00*    (2006.01)

(52) U.S. Cl. ....................................................... 307/9.1

(58) Field of Classification Search .................... 307/9.1
See application file for complete search history.

(56) References Cited

U.S. PATENT DOCUMENTS

| | | | |
|---|---|---|---|
| 6,414,867 B2 | 7/2002 | Suzuki et al. | |
| 7,742,303 B2 | 6/2010 | Azuma et al. | |
| 7,777,433 B2 | 8/2010 | Yamaguchi et al. | |
| 7,969,735 B2 * | 6/2011 | Nakatsu et al. | ............... 361/699 |
| 2001/0014029 A1 | 8/2001 | Suzuki et al. | |
| 2006/0086981 A1 | 4/2006 | Yamaguchi et al. | |
| 2006/0208660 A1 | 9/2006 | Shinmura et al. | |
| 2008/0049476 A1 | 2/2008 | Azuma et al. | |
| 2010/0188813 A1 | 7/2010 | Nakatsu et al. | |

FOREIGN PATENT DOCUMENTS

| | | |
|---|---|---|
| EP | 1881590 A2 | 1/2008 |
| JP | 2001-308246 A | 11/2001 |
| JP | 2002-164491 A | 6/2002 |
| JP | 2005-198460 A | 7/2005 |
| JP | 2006-121834 A | 5/2006 |
| JP | 2007-195292 A | 8/2007 |
| JP | 2008-29117 | 7/2008 |

OTHER PUBLICATIONS

European Search Report dated Jul. 2, 2010 (Six ((6) pages).
Japanese Office Action dated Jul. 9, 2010 (Four (4) pages).

* cited by examiner

*Primary Examiner* — Hal Kaplan
(74) *Attorney, Agent, or Firm* — Crowell & Moring LLP

(57) ABSTRACT

A power conversion apparatus capable of improving the impedance characteristics between each of two power modules and each of a plurality of capacitor cells, the power conversion apparatus including: plural capacitor cells connected in parallel between a three-layer laminated wiring board consisting of a positive polarity conductor board and a negative polarity conductor board formed widely in the direction of the parallel disposition of the power modules and laminated with an insulation sheet therebetween; a three-layer laminated conductor board consisting of a positive polarity conductor board and a negative polarity conductor board formed widely in the direction of the parallel direction of the power modules and laminated with an insulation sheet therebetween and used to connect the positive and negative polarity sides of each of the two power modules to the laminated wiring board respectively.

5 Claims, 23 Drawing Sheets

F I G . 1
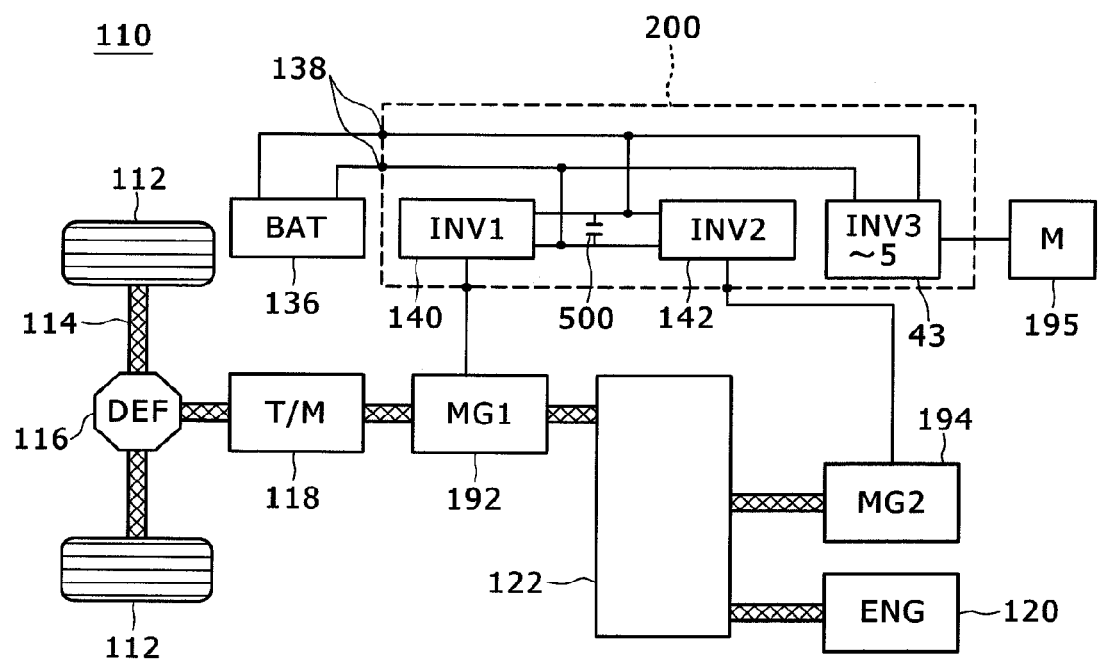

F I G . 4
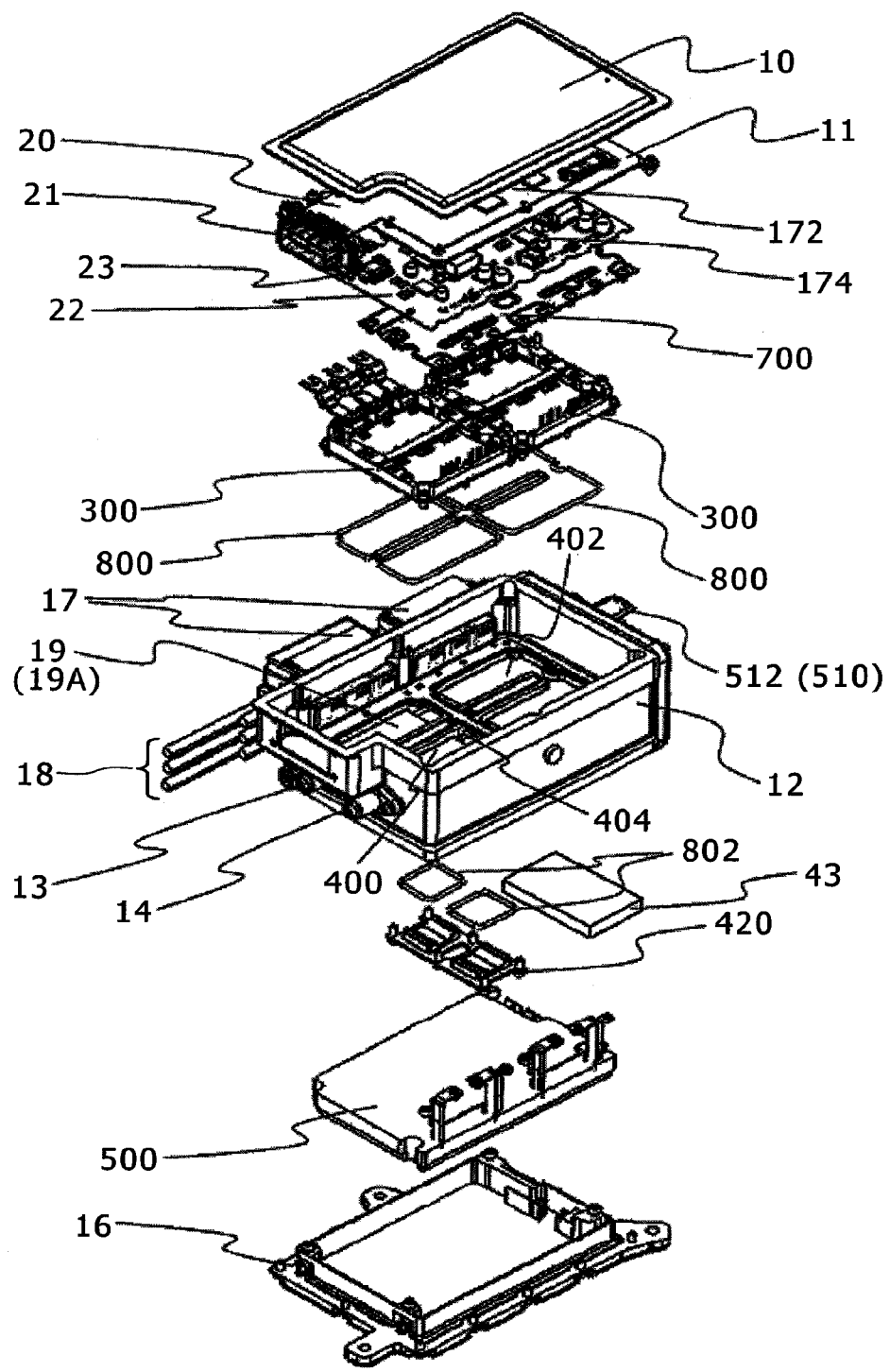

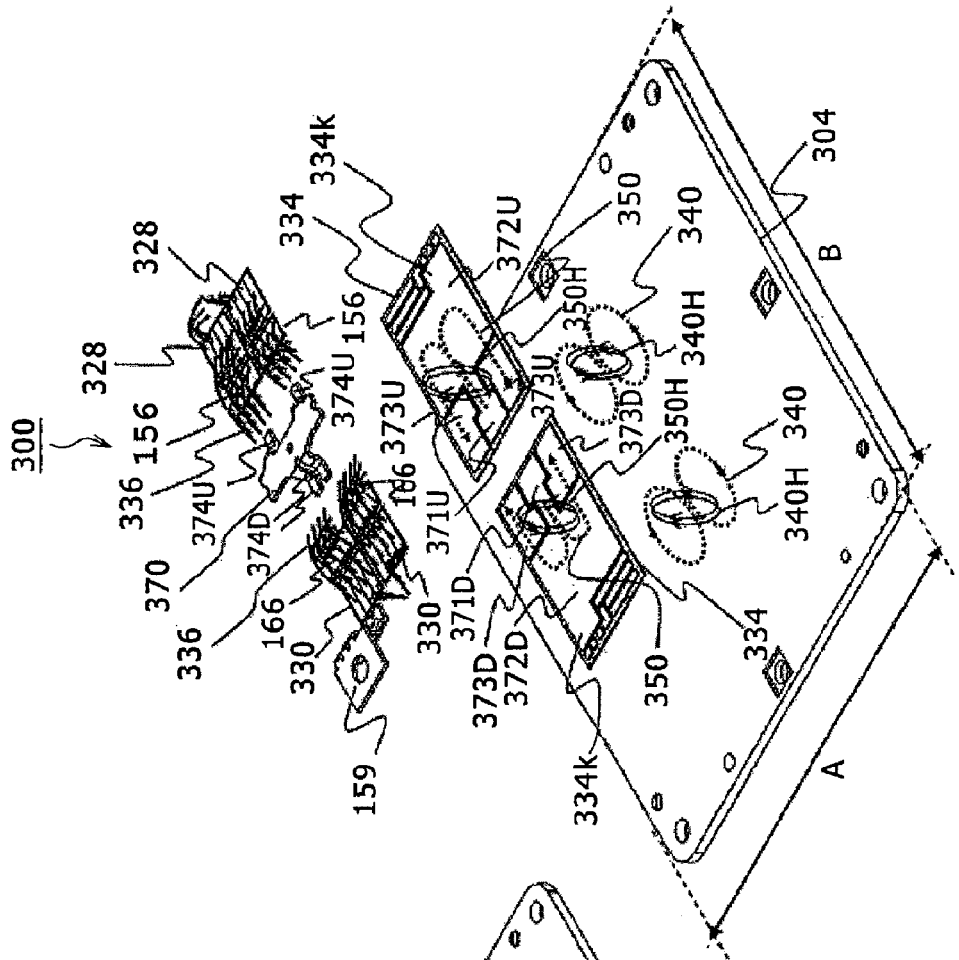
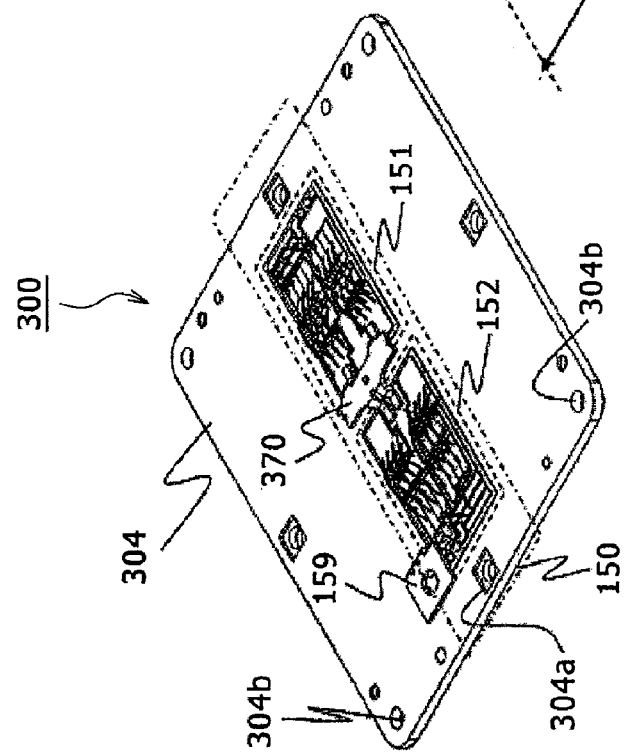

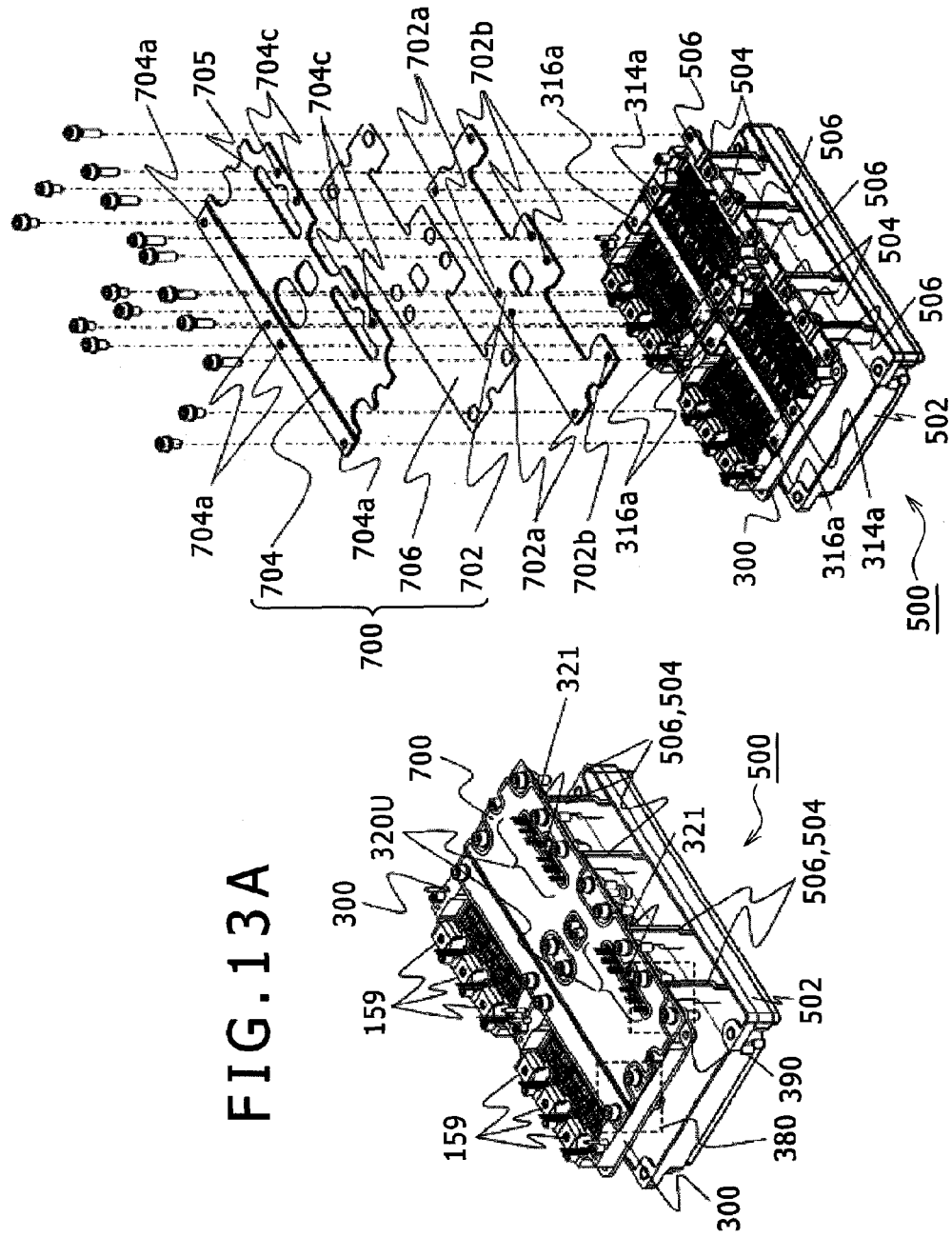

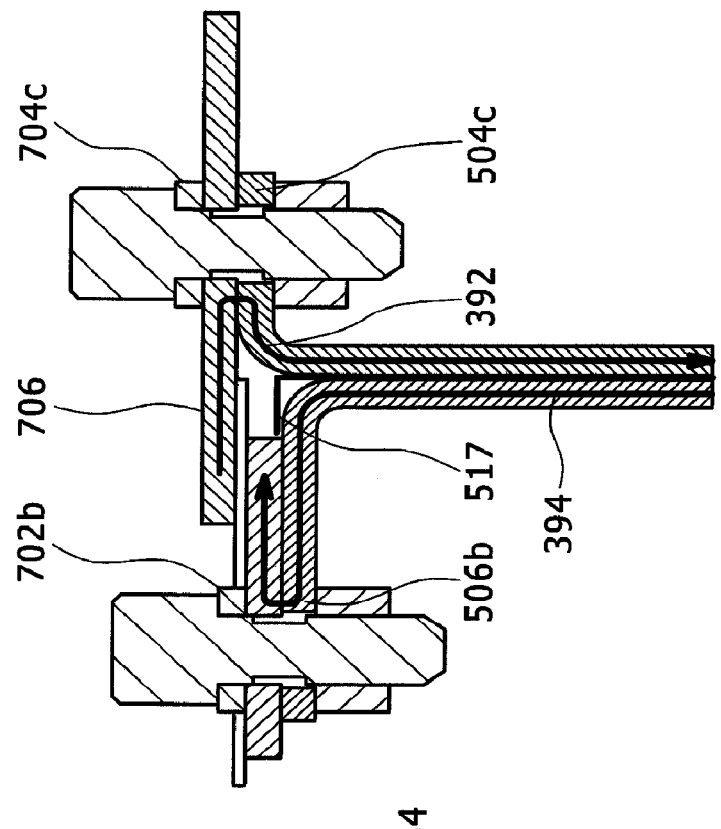
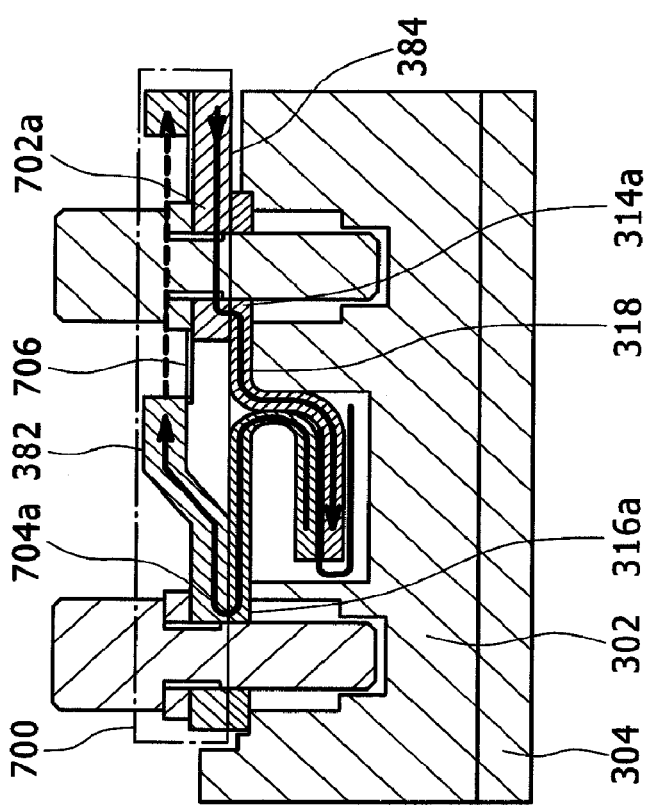
FIG. 14A
FIG. 14B

POWER CONVERSION APPARATUS AND ELECTRIC VEHICLE

This application is a continuation of U.S. patent application Ser. No. 12/472,126, filed May 26, 2009, which in turn claims the priority of Japanese application 2008-195339, filed Jul. 29, 2008. The entire disclosure of each of the above-identified applications is incorporated herein by reference.

FIELD OF THE INVENTION

The present invention relates to a power conversion apparatus that includes a power module provided with a built-in inverter circuit, as well as an electric vehicle that employs the power conversion apparatus.

BACKGROUND OF THE INVENTION

Each of well-known conventional power conversion apparatuses employs a structure that includes two power modules, on each of which are disposed control boards used for a capacitor module, as well as for those two power modules in layers (e.g., refer to JP-A No. 2008-29117).

SUMMARY OF THE INVENTION

Every power conversion apparatus has been required to minimize the impedance in the route from the capacitor module to each power module. Such a power conversion apparatus, when having two power modules, has often been confronted with problems. For example, the wiring becomes complicated, and the wiring impedance comes to differ between the routes from the capacitor module to the two power modules. And this might cause the switching semiconductor elements to have loss and difference of the withstand voltage between the power modules.

Under such circumstances, it is an object of the present invention to provide a power conversion apparatus having two power modules (a first power module and a second power module), each of which includes a built-in inverter circuit provided with a positive polarity side semiconductor switch unit and a negative polarity side semiconductor switch unit prepared for each phase. The first and second power modules are disposed in parallel. The apparatus also has a first wiring board in a three-layer laminated structure consisting of a positive polarity conductor board and a negative polarity conductor board with an insulation layer therebetween. The conductor boards are formed widely in the direction of the parallel disposition of the two power modules. Furthermore, the apparatus includes a second wiring board that connects the positive polarity side and the negative polarity side of each of the first and second power modules to the first wiring board.

Furthermore, the apparatus enables the two power modules to be disposed in parallel with respect to one plane and the first and second wiring boards to be shaped and disposed symmetrically with respect to the plane so that the impedance becomes almost equal among the routes from the plurality of capacitors to the first and second power modules.

Furthermore, the apparatus enables the first and second wiring boards to be shaped and disposed so that the impedance becomes almost equal among the routes from the plurality of capacitors to the first and second power modules. For example, the first and second power modules are disposed in parallel with respect to one plane and the first and second wiring boards are shaped and disposed symmetrically to the plane so that the impedance becomes almost equal among the routes from the plurality of capacitors to the first and second power modules.

According to the present invention, therefore, the impedance characteristics can be improved in each of the routes from the tow power modules to the plurality of capacitors.

BRIEF DESCRIPTION OF THE DRAWINGS

FIG. 1 is a block diagram of a control block of a hybrid vehicle;

FIG. 4 is an exploded view of the power conversion apparatus 200 in the embodiment of the present invention;

FIG. 10A is a diagram for describing upper and lower arms serial circuit;

FIG. 10B is an exploded diagram for describing a current path of the power module;

FIG. 13A is a partial perspective view of the power conversion apparatus 200 in the embodiment of the present invention with respect only to the capacitor module and the two power modules 300;

FIG. 13B is an exploded perspective view of a DC side conductor board;

FIG. 14A is an expanded view of a connection part between a power module and the DC side conductor board;

FIG. 14B is an expanded view of a connection part of a laminated conductor board 700;

DETAILED DESCRIPTION OF THE PREFERRED EMBODIMENTS

Figure 2:
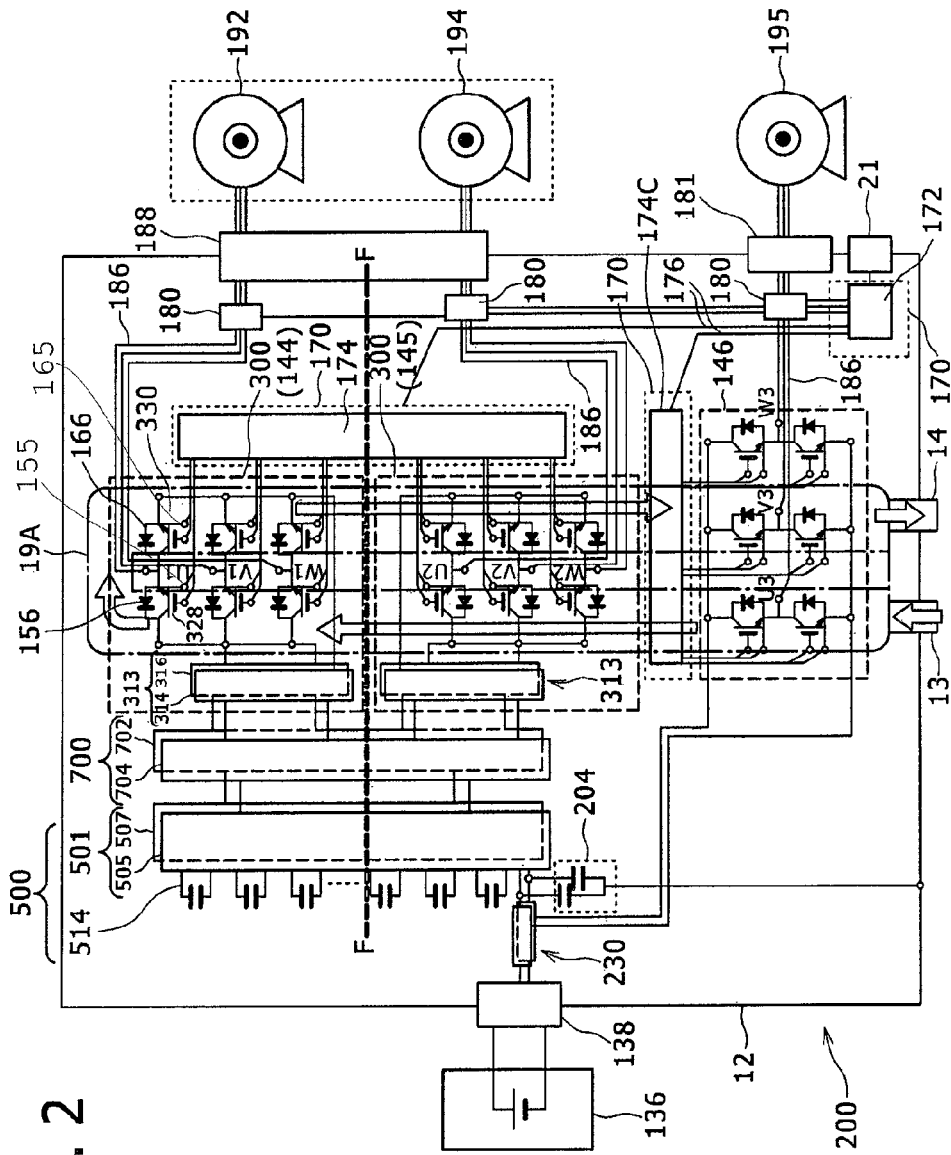
FIG. 2 is a circuit diagram of a power conversion apparatus 200.

Hereunder, there will be described the preferred embodiments of the present invention in detail with respect to a power conversion apparatus with reference to the accompanying drawings. The power conversion apparatus can apply to any of hybrid vehicles and completely electric-power-driven vehicles. Here, it is premised that the power conversion apparatus is typically applied to a hybrid vehicle and a control system configuration and a circuit configuration of the apparatus will be described with reference to FIGS. 1 and 2.

In a preferred embodiment of the present invention, the power conversion apparatus is employed typically for an on-vehicle motor system, particularly a vehicle driving inverter device usable under very severe ambient and environmental driving conditions. The vehicle driving inverter device is provided for a vehicle driving motor system assumed as a controller that controls the driving of the motor used for driving the subject vehicle. The inverter device converts a DC power supplied from an on-vehicle battery or from a on-board power generator employed as an on-vehicle power supply to a predetermined AC power and supplies the AC power to the vehicle driving motor and controls the driving of the vehicle driving motor. And because the vehicle driving motor also has power generation functions, the inverter device also functions to convert an AC power generated in the vehicle driving motor to a DC power according to the subject driving mode. The converted DC power is supplied to the on-vehicle battery.

The configuration of the power conversion apparatus to be described below is preferred to such vehicles as ordinary passenger cars, trucks, etc. However, the configuration can also apply to other power conversion apparatuses, for example, for power conversion apparatuses of trains, ships, aircrafts, etc., as well as for industrial power conversion apparatuses used as controllers of motors for driving factory facilities and for home power conversion apparatuses used as controllers of motors for driving home solar power generator systems and home electrical appliances.

FIG. 1 is a block diagram of a control block of a hybrid electric vehicle. In FIG. 1, the hybrid electric vehicle (hereunder, to be described as the "HEV") 110 is a motor-driven vehicle, which includes two vehicle driving systems. One of the driving systems is an engine system that uses an internal combustion engine 120 as a driving power source. The engine system is used mainly as a driving source of the HEV 110. The other is an on-vehicle motor system that uses two motor generators 192 and 194 as electric power sources. The on-vehicle motor system is used mainly as a driving source of the HEV 110 and a power generation source of the HEV 110. Each of the motor generators 192 and 194 is, for example, a synchronizer or inductor and the motor generator 192/194 can also operate as any of a motor and a power generator according to the operation method. In this specification, it is described as a motor generator.

Wheel shafts 114 are suitably journaled at the front side of the vehicle body. At both ends of the front wheel shafts 114 is provided a pair of front wheels 112. At the rear of the vehicle body are suitably journaled a rear wheel shaft (not shown). And at both ends of the rear wheel shaft is provided a pair of rear wheels. In case of the HEV in this embodiment, the motor-driven front wheels 112 are assumed as main wheels and the rear wheels are assumed as driven wheels. This system employed for the subject vehicle is a so-called front-wheel driving system. However, the reversal system, that is, the rear-wheel driving system may also be employed for the subject vehicle.

In the center of the front wheel shaft 114 assembly is provided a front wheel side differential gear (hereunder, to be described as the front wheel side DEF) 116. The front wheel shafts 114 are connected mechanically to the output side of the front wheel side DEF 116. The output shaft of a speed reduction gear 118 is connected mechanically to the input side of the front wheel side DEF 116. The front wheel side DEF 116 is a differential power distribution mechanism that distributes the rotation power changed and transmitted by the speed reduction gear 118 to the right and left front wheel shafts 114. The input side of the speed reduction gear 118 is connected mechanically to the output side of the motor generator 192. The input side of the motor generator 192 is connected mechanically to the output side of the engine 120 and to the output side of the motor generator 194 through the power distribution mechanism 122 respectively. The motor generator 192/194 and the power distribution mechanism 122 are housed in the case of the speed reduction gear 118.

The motor generator 192/194 is a synchronizer provided with an eternal magnet in its rotator. The driving of the motor generator 192/194 is controlled according to the state of the controlling of the AC power supplied to the motor coil of the stator by the inverter device 140/142. The inverter device 140/142 is connected to a battery 136 so that the power can be sent/received between the battery 136 and the inverter device 140/142.

In this embodiment, the HEV 110 includes a first power generation unit consisting of a motor generator 192 and an inverter device 140 and a second power generation unit consisting of a motor generator 194 and an inverter device 142. The HEV 110 selects one of the two power generation units according to the state of operation. In other words, when the subject vehicle is driven by the engine 120 and the vehicle driving torque requires an external assistance, the second power generation unit is selected to drive the vehicle with the driving power of the engine 120 and the driving power is used to operate the first power generation unit that functions as an electric unit. In the similar situation, when assisting the speed of the subject vehicle, the first power generation unit is driven by the engine 120 to generate a power and the obtained power is used to operate the second power generation unit, which then comes to function as an electric unit.

In this embodiment, the battery 136 is used to operate the second power generation unit, which then comes to function as an electric unit, thereby the subject vehicle can be driven only with the power of the motor generator 192. Furthermore, in this embodiment, the first or second power generation unit can be driven by the driving power of the engine 120 or by the driving power from the vehicle wheels so as to generate a power usable to charge the battery 136.

The battery 136 is also used as a power source for driving an auxiliary motor 195. There are some types for such auxiliary motors, for example, motors for driving air conditioner compressors and motors for driving control oil pressure pumps. The inverter device 43 converts a DC power supplied from the battery 136 to an AC power and supplies the converted AC power to the motor 195. The inverter device 43, having the same function as those of the inverters 140 and 142, controls the phase and frequency of the AC power supplied to the motor 195. For example, the motor 195 generates a torque upon receiving an AC power having an advanced phase with respect to the rotation of its rotator. On the other hand, the motor 195 functions as a power generator and enters a regenerative breaking state operation upon receiving a delayed phase AC power. In such a way, the inverter device 43 functions as a controller just like the inverter device 140/142. Here, because the capacity of the motor 195 is smaller than that of the motor generator 192/194, the maximum power conversion of the inverter device 43 is smaller than that of the inverter device 140/142, but the circuit configuration of the inverter device 43 is basically the same as that of the inverter device 140/142.

There is a close electrical relationship among each of the inverter devices 140, 142, and 43, and the capacitor module 500. Furthermore, all of those components are commonly required to have preventive measures for their heat generation. Furthermore, the power conversion apparatus 200 is also required to be minimized in cubic volume. In order to meet those requirements, the power conversion apparatus 200 to be described in detail below comes to have built-in inverter devices 140, 142, and 43, as well as the capacitor module 500. Employing such a configuration has successfully realized a compact and highly reliable power conversion apparatus 200 as described above.

Because the inverters 140, 142, and 43, as well as the capacitor module 500 are all built in one casing as described above, the power conversion apparatus 200 can be simplified in wiring and protected from noise. In addition, the inductance of the circuit for connecting the capacitor module to each of the inverter devices 140, 142, and 43 can be reduced, thereby both the spike voltage and the heat generation are reduced, and the heat releasing efficiency is improved.

Next, there will be described the circuit configuration of the power conversion apparatus 200 with reference to FIG. 2. As shown in FIG. 1, the power conversion apparatus 200 includes the inverter devices 140 and 142, the auxiliary inverter device 43, and the capacitor module 500. The inverter devices 140, 142, and 43 are all the same in configuration and function.

The inverter device 140 includes a power module 300 provided with an inverter circuit 144 and a DC terminal 313. The inverter device 142 includes a power module 300 provided with an inverter circuit 145 and a DC terminal 313. And the inverter device 43 includes a power module provided with an inverter circuit 146. As to be described later, each power module 300 includes an inverter circuit and its wiring, a heat releasing base, etc.

The driving of each of the inverter circuits 144, 145, and 146 is controlled by its corresponding driver circuit 174A/174B/174C provided in the controller 170. The driver circuit shown in FIG. 2 is a combination of the driver circuits 174A and 174B. The control circuit 172 controls each of those driver circuits 174A to 174C. The control circuit 172 generates switching signals used for controlling switching timings of the switching power semiconductor elements.

The inverter circuit 144 consists of a 3-phase bridge circuit. The inverter circuit 144 includes a positive polarity side semiconductor switch device connected to the positive polarity side and a negative polarity side semiconductor switch device connected to the negative polarity side with respect to each of the U phase (denoted with U1), the V phase (denoted with V1), and the W phase (denoted with W1). The positive and negative polarity side semiconductor switch devices are paired to form upper and lower arm serial circuits. The positive polarity side semiconductor switch device includes an upper arm IGBT 328 (insulation gate type bipolar transistor) and a diode 156. The negative polarity side semiconductor switch device includes a lower arm IGBT 330 and a diode 166.

The upper and lower arm serial circuits are electrically connected in parallel between the DC positive and negative polarity terminals 314 316 of the DC terminal 313. The DC positive and negative polarity terminals 314 and 316 are formed with a wide conductor board material in the direction of the parallel disposition (vertical direction) of the two power modules 300 respectively. The DC terminal 313 is formed as a 3-layered wiring board with an insulation paper (not shown) among those three layers and disposed between the DC positive and negative polarity terminals 314 and 316.

Each of the IGBTs 328 and 330 is driven according to a driving signal outputted from the driver circuit 174A (174) to convert the DC power received from the battery 136 to a 3-phase AC power. This converted AC power is supplied to an armature coil of the motor generator 192. Here, the reference numerals 328, 330, 156, and 166 that are otherwise used for both V and W phases are omitted. The configuration of the power module 300 of the inverter device 142 is the same as that of the inverter device 140, and the configuration of the inverter circuit 146 of the inverter device 43 is the same as that of the inverter circuit 144, so that the description will be omitted here.

In this embodiment, the IGBTs 328 and 330 are used as switching power semiconductor elements. Each of the IGBTs 328 and 330 includes a collector electrode, an emitter electrode (emitter electrode terminal for signals), and a gate electrode (gate electrode terminal). Diodes 156 and 166 are connected electrically between the collector electrodes and the emitter electrodes of the IGBTs 328 and 330 respectively as shown in FIG. 2. Each of the diodes 156 and 166 includes two electrodes that are a cathode electrode and an anode electrode. The cathode electrode is electrically connected to its corresponding IGBT 328/330 and the anode electrode is electrically connected to the emitter electrode of the IGBT 328/330 so as to make the direction from the emitter electrode to the collector electrode of the IGBT 328/330 forward. A MOSFET (Metal Oxide Semiconductor Field Effective Transistor) may be used as a switching power semiconductor element. In this case, both the diodes 156 and 166 become unnecessary.

The control circuit 172 generates timing signals for controlling the switching timings of the IGBTs 328 and 330 according to the input information from the controllers, sensors (e.g., a current sensor 180), etc. of the subject vehicle. The driver circuit 174 generates driving signals used for switching operations of the IGBTs 328 and 330 according to the timing signals outputted from the control circuit 172.

The control circuit 172 includes a microcomputer used for computing the switching timings of the IGBTs 328 and 330. The microcomputer inputs a target torque value requested to the motor generator 192, a current value supplied from the upper/lower serial circuit to the armature coil of the motor generator 192, and a position of the magnetic pole of the rotator of the motor generator 192 as input information. The target torque value is determined by the command signal outputted from the host controller (not shown). The current value is detected according to a detection signal outputted from the current sensor 180. The position of the magnetic pole is detected according to the detection signal outputted from the rotating magnetic pole sensor (not shown) provided for the motor generator 192. In this embodiment, current values of three phases are detected as an example, but the current values of only two of those phases may be detected.

The microcomputer in the control circuit 172 computes a current command value for each of the d and q shafts of the motor generator 192 according to the target torque value. The microcomputer also computes the voltage command values for those d and q shafts according to the differences between the current command values for the d and q shafts and the detected current values of the d and q shafts. The microcomputer then converts the voltage command values of the computed d and q shafts to the voltage command values for the U, V, and W phases according to the detected position of the magnetic pole respectively. After this, the microcomputer generates a pulse-like modulated wave according to the result of comparison between the basic wave (sine wave) and the carrier wave (triangle wave) on the basis of each of the voltage command values of the U, V, and W phases and outputs the generated modulated wave to the driver circuit 174 as a PWM (pulse width modulation) signal.

The driver circuit 174, when driving the lower arm, amplifies the PWM signal and outputs the amplified PWM signal to the gate electrode of the lower arm IGBT 330 as a driving signal. On the other hand, when driving the upper arm, the driver circuit 174 shifts the reference potential level of the PWM signal to the upper arm reference potential level, then amplifies the PWM signal and outputs the amplified PWM signal to the gate electrode of the upper arm IGBT 328. Consequently, each IGBT 328/330 makes switching according to the inputted driving signal.

The controller 170 detects abnormal states (overcurrent, overvoltage, excessive temperature, etc.) to protect the upper and lower arm serial circuits. Therefore, the controller 170 inputs sensing information. For example, each arm signal emitter electrode terminal 155/165 outputs the information of a current flowing in the emitter of each IGBT 328/330 to its corresponding driver (IC). Consequently, each driver (IC) detects an overcurrent. Thus the driver (IC), upon detecting an overcurrent, instructs the corresponding IGBT 328/330 to stop the switching operation to protect the IGBT 328/330 from the overcurrent. The microcomputer inputs temperature information of the upper/lower arm serial circuit from the temperature sensor (not shown) provided in the upper/lower arm serial circuit. The microcomputer also inputs the DC positive polarity side voltage information of the upper/lower arm serial circuit. According to those information items, the microcomputer detects excessive temperature and overcurrent. The microcomputer, upon detecting an excessive temperature or overvoltage, instructs the IGBT 328/330 to stop the switching operation to protect the upper/lower arm serial circuit from the excessive temperature or overcurrent.

In the inverter device 140, the conductivity of the upper/lower arm IGBT 328/330 is turned on/off cyclically. When the conductivity is turned on/off, the stator coil of the motor generator 192 generates a current, which is then flown in the object circuit that includes the diode 156/166. In the power conversion apparatus 200 in this embodiment, one upper/lower arm serial circuit is provided for each phase of the inverter device 140. The power conversion apparatus 200 may also take another configuration in which two upper/lower arm serial circuits are connected in parallel for each phase as a circuit that generates 3-phase AC outputs to the object motor generator.

The DC terminals 313 of the inverter devices 140 and 142 are connected to a common laminated conductor board 700, respectively. The laminated conductor board 700 includes wiring boards formed in a 3-layer structure consisting of a positive polarity side conductor board 702 and a negative polarity side conductor board 704 made of a conductor board material wide in the direction of the disposition of power modules, respectively. An insulation sheet (not shown) is put between those conductor boards 702 and 704. The positive and negative polarity side conductor boards 702 and 704 of the laminated conductor board 700 are connected to a positive polarity conductor board 507 and a negative polarity conductor board 505 of a laminated wiring board 501 of the capacitor module 500 respectively. Each of the positive and negative polarity conductor boards 507 and 505 is made of a conductor board material wide in the direction of the power module disposition so as to configure a laminated wiring board in a 3-layer structure in which an insulation sheet (not shown) is disposed between those plates 507 and 505.

A plurality of capacitor cells 514 are connected to the capacitor module 500 in parallel. The positive pole side of each capacitor cell is connected to the positive polarity conductor board 507 and the negative side thereof is connected to the negative polarity conductor board 505. The capacitor module 500 is formed as a smoothing circuit used to suppress the variation of the DC voltage that otherwise occurs due to the switching operation of each IGBT 328/330.

The laminated wiring board 501 of the capacitor module 500 is connected to an input laminated wiring board 230 connected to a DC connector 138 of the power conversion apparatus 200. The inverter circuit 146 of the auxiliary inverter device 43 is also connected to the input laminated wiring board 230. A noise filter 204 is provided between the input laminated wiring board 230 and the laminated wiring board 501. The noise filter 204 includes two capacitors, each of which connects the ground terminal of the apparatus casing 12 to each of the DC power lines to configure a Y capacitor that prevents common mode noise.

Reference numeral 19A denotes a cooling jacket in which a cooling water flow path is formed. The cooling water flows from the cooling water inlet pipe 13 and back in a U-letter pattern as shown with an arrow line, then flows out of the outlet pipe 14. The inverter circuit 144/145 is disposed in the cooling water flow path and the upper arm side IGBT and its diode are disposed in the forward flow and the lower arm side IGBT and its diode are disposed in the backward flow of the cooling water path in each inverter circuit. 176 denotes a signal cable that identifies with a signal cable 102 as shown in FIG. 2. 181 denotes an AC connector for connecting a wiring of the auxiliary motor 195.

In FIGS. 3 through 11, reference numerals are defined as follows: 200 denotes a power conversion apparatus, 10 denotes an upper case, 11 denotes a metal base plate, 12 denotes an apparatus casing, 13 denotes a cooling water inlet pipe, 14 denotes a cooling water outlet pipe, 420 denotes a cover, 16 denotes a lower case, 17 denotes an AC terminal case, 18 denotes an AC terminal, 19 denotes a cooling water path, 20 denotes a control circuit board that holds the control circuit 172. Furthermore, 21 denotes a connector to an external device/unit, 22 denotes a driving circuit board that holds the driving circuit 174. And 300 denotes each of two power modules (semiconductor modules). One of the power modules 300 has a built-in inverter circuit 144 and the other power module 300 has a built-in inverter circuit 145. Furthermore, 700 denotes a laminated conductor board, 800 denotes an O-ring, 304 denotes a metal base, 188 denotes an AC connector, 314 denotes a DC positive polarity terminal, 316 denotes a DC negative polarity terminal, 500 denotes a capacitor module, 502 denotes a capacitor case, 504 denotes a positive polarity side capacitor terminal, 506 denotes a negative polarity side capacitor terminal, and 514 denotes each capacitor cell.

Figure 3:
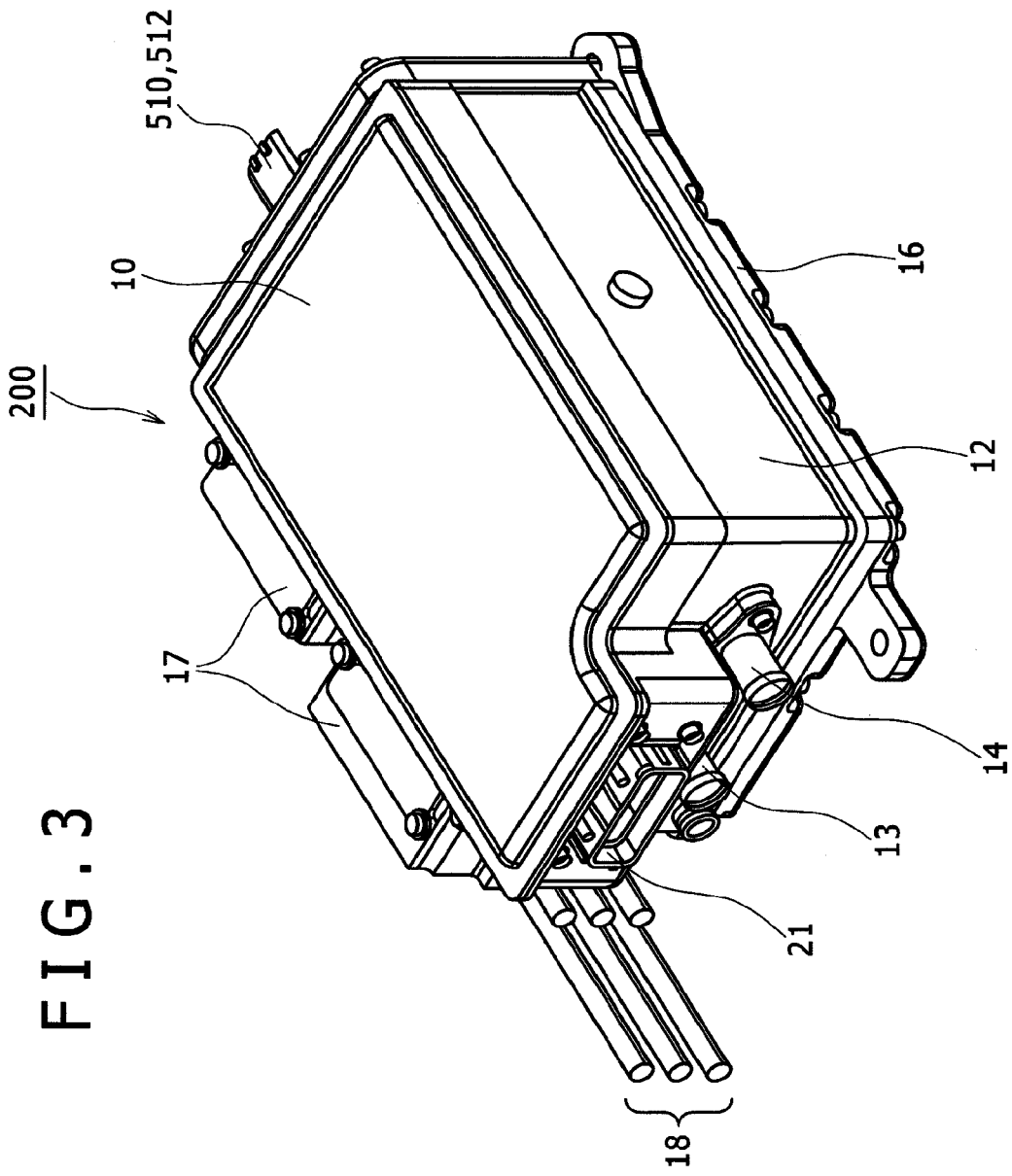
FIG. 3 is a perspective inside view of a power conversion apparatus 200 in an embodiment of the present invention.
Figure 5:
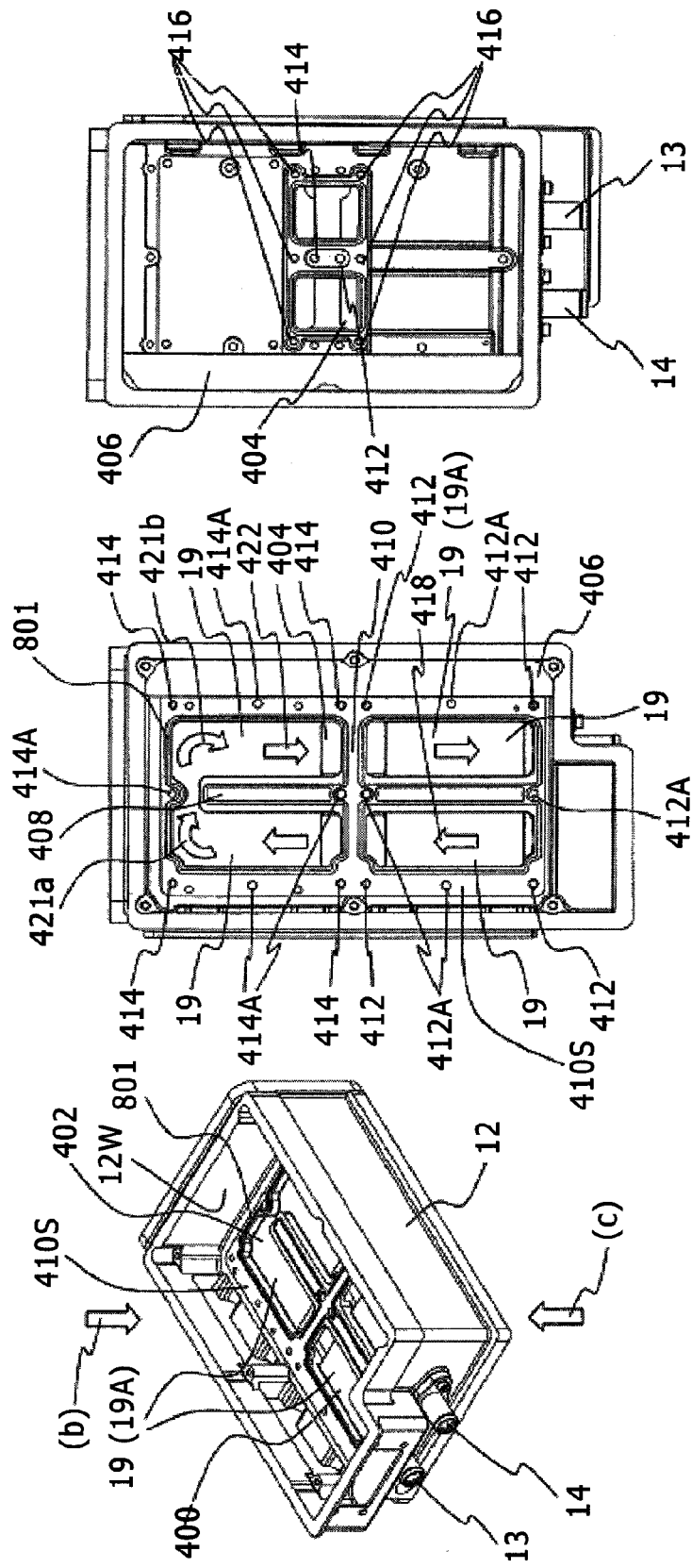
FIG. 5A is a perspective view of the aluminum cast casing of the power conversion apparatus 200, which includes an input pipe and an outlet pipe of a cooling water path.
FIG. 5B is a top view of the apparatus casing.
FIG. 5C is a bottom view of the apparatus casing.

FIG. 3 is a perspective outside view of the power conversion apparatus 200 in this embodiment of the present invention. Among the components of the power conversion apparatus 200, the apparatus casing 12 of which top or bottom surface is approximately rectangular in shape, both the cooling water inlet and outlet pipes 13 and 14 provided at the outer periphery of one of the short sides of the apparatus casing 12, the upper case 10 used to block the upper opening of the apparatus casing 12, and the lower case 16 used to block the lower opening of the apparatus casing 12 are all provided outside the power conversion apparatus 200. Because the bottom or top surface of the apparatus casing 12 is approximately rectangular in shape, the power conversion apparatus 200 can be fastened to the subject vehicle more easily and manufactured more easily.

At the outer peripheries of the long sides of the power conversion apparatus 200 are provided two pairs of AC terminal cases 17 used for connecting the motor generators 192 and 194 respectively. The AC terminal 18 is used to electrically connect a power module 300 to each of the motor generators 192 and 194. The AC current to be outputted from the power module 300 is transmitted to the motor generators 192 and 194 through the AC terminal 18.

The connector 21 is connected to the control circuit board 20 built in the apparatus casing 12. Types of signals received from external are transmitted to the control circuit board 20 through the connector 21. The DC (battery) negative and positive polarity side connection terminals 510 and 512 are used to connect electrically the battery 136 to the capacitor module 500 respectively. In this embodiment, the connector 21 is provided on the outer periphery surface of one of the short sides of the apparatus casing 12. On the other hand, the DC (battery) negative and positive polarity side connection terminals 510 and 512 are provided on the outer peripheral surface of the other short side. This means that the connector 21 is separated from the DC (battery) negative polarity side connection terminal 510. This makes it possible to reduce the noise that enters the apparatus casing 12 from the DC (battery) negative polarity side connection terminal 510 and transmitted up to the connector 21, thereby the control circuit board 20 comes to further improve the motor controllability.

FIG. 4 is an exploded perspective view of the power conversion apparatus 200 in this embodiment of the present invention.

As shown in FIG. 4, in a middle part of the apparatus casing 12 is provided the cooling jacket 19A in which the cooling water path 19 is formed. And above the cooling jacket 19A are formed two pairs of openings 400 and 402 side by side in the direction of the water flow. Two power modules 300 are fastened to the top surface of the cooling jacket 19A so as to block the two pairs of openings 400 and 402. Each power module 300 includes heat releasing fins 305 (see FIGS. 9A and 9B) and the fins 305 are protruded into the cooling water path 19 through the openings 400 and 402 of the cooling jacket 19A, respectively.

At the bottom surface of the cooling jacket 19A are formed an opening 404 that enables aluminum casting to be made more easily. The opening 404 is blocked up by the lower cover 420. At the bottom surface of the cooling jacket 19A is provided the auxiliary inverter device 43. The inverter device 43 includes a power module in which power semiconductor elements of the inverter circuit 146 are built as shown in FIG. 2. The inverter device 43 is fastened to the bottom surface of the cooling jacket 19A so that the heat releasing metal surface of the built-in power module faces the bottom surface of the cooling jacket 19A. A sealing O-ring 800 is provided between the power module 300 and the apparatus casing 12. Another O-ring 802 is provided between the lower cover 420 and the apparatus casing 12. In this embodiment, O-rings are used as sealing materials. Those O-rings may be replaced with any of resin materials, liquid sealing packing, etc. Particularly, if a liquid sealing material is used, assembling of the power conversion apparatus 200 will be made more efficiently.

Under the cooling jacket 19A is provided the lower case 16. The lower case 16 includes the capacitor case 500. The capacitor module 500 is fastened to the inner surface of the bottom plate of the lower case 16 so that the heat releasing surface of the metal case comes in contact with the inner surface of the bottom plate of the lower case 16. This structure makes it possible to use the top and bottom surfaces of the cooling jacket 16 to improve the cooling efficiency of the power module 300 and the inverter device 43, thereby the power conversion apparatus 200 can be more reduced in size.

The cooling water, when flowing from the inlet and outlet pipes 13 and 14 of the path 19, cools down the heat releasing fins of the two power modules 300 disposed side by side, thereby those two power modules 300 are cooled down entirely. Similarly, at this time, the auxiliary inverter device 43 is also cooled down at the bottom surface of the cooling jacket 19A.

Furthermore, when the apparatus casing 12 in which the cooling jacket 19A is formed is cooled down, the lower case 16 is also cooled down in the lower portion of the apparatus casing 12. The heat of the capacitor module 500 is thus transmitted into the cooling water through the lower case 16 and the apparatus casing 12, thereby the capacitor module 500 is cooled down.

Above the power module 300 is disposed a laminated conductor board 700 that connects each power module 300 to the capacitor module 500. This laminated conductor board 700 is formed over the two power modules 300 in the direction of their parallel disposition. The laminated conductor board 700 consists of a positive polarity side conductor board 702 (see FIGS. 13A and 13B) connected to the positive polarity conductor board 507 (see FIG. 12) of the capacitor module 500, a negative polarity side conductor board 704 (see FIGS. 13A and 13B) connected to the negative polarity conductor board 505 of the capacitor module 500, and an insulation sheet 706 (see FIG. 13B) disposed between those conductor boards 702 and 704. Consequently, the laminated area of the laminated conductor board 700 can be widened, thereby the parasitic inductance from each power module 300 to the capacitor module 500 can be reduced. Furthermore, if one laminated conductor board 700 is used for two power modules 300, the electrical connection can be made among the laminated conductor board 700, the power module 300, and the capacitor module 500. Therefore, even when the subject power conversion apparatus includes two power modules 300, the number of assembling processes can be suppressed.

Above the laminated conductor board 700 are disposed a control circuit board 20 and a driving circuit board 22. The driving circuit board 22 includes the driver circuit 174 (174A, 174B) shown in FIG. 2 and the control circuit board 20 includes the control circuit 172 that includes a CPU shown in FIG. 2. And a metal base plate 11 is disposed between the driving circuit board 22 and the control circuit board 20. The metallic base plate 11 functions as a magnetic shield for the circuits mounted on the boards 22 and 20 and functions to release the heat generated from the driving circuit board 22 and from the control circuit board 20, thereby cooling down the circuit boards 22 and 20. In a center part of the apparatus casing 12 is provided the cooling jacket 19A. And at one side of the cooling jacket 19A are disposed the power modules 300 that drive the motor generators 192 and 194 respectively, and at the other side is disposed the auxiliary inverter device (power module) 43. The power conversion apparatus 200 can thus be cooled down at a smaller space, thereby the apparatus 200 can be reduced in total size. And because the cooling jacket 19A and the apparatus casing 12 are united into one by aluminum casting, the cooling jacket 19A can be improved in cooling efficiency and in mechanical strength. This aluminum casting, which enables the apparatus casing 12 and the cooling jacket 19A to be united into one, can also improve the thermal conductivity, so that it is possible to improve the cooling efficiency of the driving circuit board 22, the control circuit board 20, and the capacitor module 500 disposed farther from the cooling jacket 19A.

The driving circuit board 22 includes an inter-board connector 23 that connects the circuits of the control circuit board 20 passing through the metal base plate 11. The control circuit board 20 includes a connector 21 used for electrical connection to an object external device/unit. The connector 21 is also used to transmit signals to/from an on-vehicle battery 136 provided outside the power conversion apparatus 200, that is, a lithium battery module. The control circuit board 20 receives battery state signals, lithium battery charging state signals, etc. from the lithium battery module. A signal cable 176 (not shown in FIG. 4) shown in FIG. 2 is laid to the inter-board connector 23 and the signal cable 176 transmits inverter circuit switching timing signals from the control circuit board 20 to the driving circuit board 22. As a result, the driving circuit board 22 can generate gate driving signals to be applied to the gate electrode of each-power module.

An opening is formed at each of the top and bottom end parts of the apparatus casing 12. These openings are blocked when the upper and lower cases 10 and 16 are fastened to the apparatus casing 12 with such fastening parts as screws and bolts. In a center part of the height of the apparatus casing 12 is formed the cooling jacket 19A in which the cooling water path 19 is formed. The top surface opening of the cooling jacket 19A is covered by the power module 300 and the bottom surface opening is covered by the lower cover 420, thereby the cooling water path 19 is formed in the cooling jacket 19A. In this state, a water leak test is carried out for the cooling water path 19 in an assembly process. When the water path 19 passes the leak test, necessary boards and the capacitor module 500 are fastened in the apparatus casing 12 through the upper and lower openings. The power conversion apparatus 200 is structured so as to enable the cooling jacket 19A to be disposed in the center of the apparatus casing 12 and to fix necessary parts in the apparatus casing 12 through the top and bottom openings in such a way. Thus the apparatus productivity is improved. In addition, because the cooling water path 19 is completed first, then the water leak test is carried out and other necessary parts are assembled into the apparatus 200, both productivity and reliability of the apparatus 200 are improved.

FIGS. 5A to 5C illustrate how the cooling water input and outlet pipes are attached to the aluminum cast apparatus casing 12 in which the cooling jacket 19A is formed. FIG. 5A is a perspective view of the apparatus casing 12, FIG. 5B is a top view of the apparatus casing 12, and FIG. 5C is a bottom view of the apparatus casing 12. As shown in FIGS. 5A to 5C, the apparatus casing 12 is united with the cooling jacket 19A into one. The cooling jacket 19A includes the cooling water path 19 in it. On the surface of one of the short sides of the apparatus casing 12, which is approximately rectangular at its top view are provided the cooling water input pipes 13 and 14.

The cooling water supplied from the inlet pipe 13 into the path 19 flows along the long side of the rectangular shape as shown with an arrow line 418. The cooling water turns back just before the surface of the other short side of the rectangular shape as shown with arrows 421a and 421b. The cooling water then flows in the direction shown with an arrow 422 along the long side of the rectangular shape again and goes out from an exit hole (not shown) into the inlet pipe 14. At the top surface of the cooling jacket 19A are formed four openings 400 and 402. The openings 400 are provided one for the going flow and one for the returning flow of the cooling water. The openings 402 are also provided one for the going flow and one for the returning flow of the cooling water. A power module 300 is fastened to each of the openings 400 and 402. The heat releasing fins of each power module 300 are protruded through the opening into the flow of the cooling water. The two pairs of the power modules 300 disposed in the cooling water flowing direction, that is, in the longitudinal direction of the apparatus casing 12 are fastened so as to close the openings of the cooling water jacket 19A water-tightly through such a sealing material as an O-ring 800, respectively. 801 denotes a seal groove for holding the O-ring 800.

The cooling water jacket 19A is molded unitarily with the apparatus casing 12 so as to cross the middle step of the peripheral wall 12W of the apparatus casing 12. Through the top surface of the cooling jacket 19A are provided four openings 400 and 402 and through the bottom surface is provided one opening 404. Around each of those openings 400 and 402 is provided a power module fastening surface 410S. A part between those openings 400 and 402 on the fastening surface 410S is referred to as a supporting block 410. One power module 300 is fastened to the inlet/outlet side of the cooling water with respect to the supporting block 410 and the other power module 300 is fastened to the turn-back side of the cooling water with respect to the supporting block 410. A screw hole 412 shown in FIG. 5B is used to fasten the inlet/outlet side power module 300 to the fastening surface 410S so as to seal the openings 400. The screw hole 414 is used to fasten the turn-back side power module 300 to the fastening surface 410S. This fastening comes to seal the openings 402. Because each power module 300 is disposed so as to cross both going and returning flows of the cooling water in such a way, the inverter circuits 144 and 145 can be disposed very closely to each another on a metal base 304 (see FIG. 8). The power modules 300 can thus be reduced in size, thereby the power conversion apparatus 200 can also be reduced in size significantly. Each of 412A and 414A denotes a screw hole for connecting the power module 300 (shown in FIG. 7A) to the fastening surface 410S with a screw (not shown).

The inlet/outlet side power module 300 is cooled down by the cooler water from the inlet pipe 13 and by the water warmed slightly by the heat from heat generation parts near the exit. On the other hand, the return side power module 300 is cooled down by the water that is cooler than the water near the outlet pipe 14. As a result, the positional relationship between the turn-back cooling water flow and two power modules 300 comes to have a merit that the cooling efficiency is balanced well between the two power modules 300.

The supporting block 410 is used to fasten the power modules 300 and it is required to seal the openings 400 and 402 water-tightly. The supporting block 410 is also effective to improve the strength of the apparatus casing 12. As described above, the cooling water path 19 has a turn-back flow and a partition wall 408 is provided between the going and returning flows. This partition wall 408 is formed unitarily with the supporting block 410. While the partition wall 408 separates the going flow from the returning flow, the wall 408 also functions to improve the mechanical strength of the apparatus casing 12. The partition wall 408 can also be effective to make the temperature of the cooling water uniform, since it functions to transmit the heat of the cooling water in the returning flow to the cooling water in the going flow. If there is a large temperature difference in the cooling water between the inlet side and the outlet side, the cooling efficiency comes to be varied in places significantly. While such a temperature difference appears unavoidably, the partition wall 408 formed unitarily with the supporting block 410 can suppress the temperature difference of the cooling water considerably.

FIG. 5C shows the back side of the cooling jacket 19A; an opening 404 is formed at the back side corresponding to the supporting block 410. This opening 404 improves the yield in the casting process of the apparatus casing 12 when the supporting block 410 and the apparatus casing 12 are united into one. The forming of this opening 404 is effective to eliminate the double structure consisting of the supporting block 410 and the bottom of the cooling water path 19, thereby the casting is made more easily and the apparatus productivity is improved. 416 denotes a screw hole for connecting the lower cover 420 (shown in FIG. 4) to the cooling water jacket 19A (shown in FIG. 5A) with a screw (not shown).

Then, a through-hole 406 is formed at the outer surface of the side wall of the cooling water path 19. Electrical components (the power modules 300 and the capacitor module 500) disposed at both sides of the cooling water path 19 are connected to each other through this hole 406.

Because the apparatus casing 12 can be formed unitarily with the cooling jacket 19A as described above, casting, particularly, aluminum die-casting can be employed suitably for the apparatus casing 12.

Figure 6:
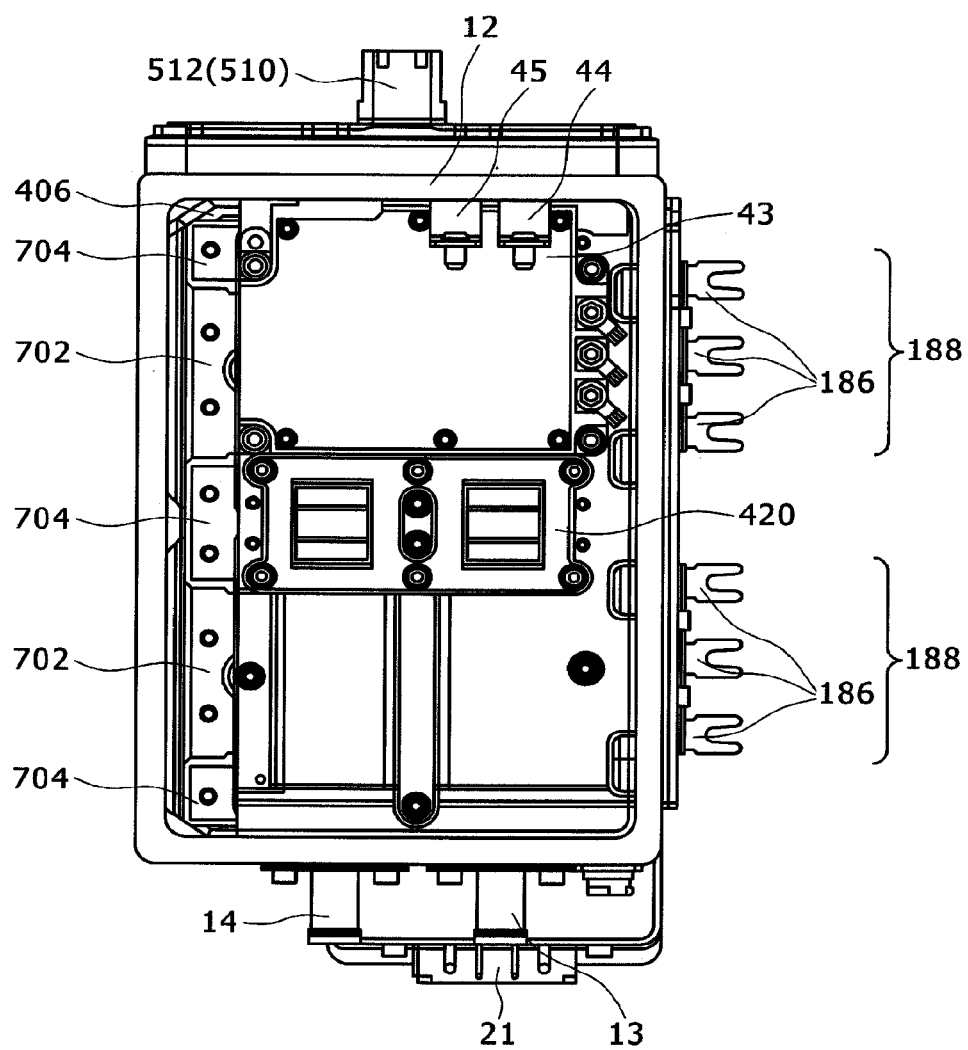
FIG. 6 is a detailed bottom view of the apparatus casing.

The power module 300 is fastened to the top surface opening of the cooling jacket 19A, then the lower cover 420 is fastened to the back side opening of the cooling jacket 19A as shown in FIG. 6. An AC power line 186 and an AC connector 188 are protruded outside the apparatus casing 12 at one long side of the rectangular apparatus casing 12.

In FIG. 6, a through-hole 406 is formed inside the side wall of the other long side of the rectangular apparatus casing 12 and part of the laminated conductor board 700 connected to the power module 300 is seen through the hole 406. The auxiliary inverter device 43 is disposed near one side surface of the apparatus casing 12 to which the DC positive polarity side connection terminal 512 is connected. The capacitor module 500 is disposed in a lower portion (at the opposite side of the side where the cooling water path 19 is provided) of the inverter device 43. The auxiliary machine positive and negative polarity terminals 44 and 45 are protruded downward (in the direction of the disposed capacitor module 500) and connected to the auxiliary machine positive and negative polarity terminals 532 and 534 at the side of the capacitor module 500 respectively. Consequently, the wiring distance between the capacitor module 500 and the inverter device 43 is shortened, so that it is possible to reduce the noise that might otherwise enter the control circuit board 20 from the auxiliary machine positive and negative polarity terminals 532 and 534 at the side of the capacitor module 500 through the metallic apparatus casing 12.

The inverter device 43 is disposed between the cooling water path 19 and the capacitor module 500. The height of the inverter device 43 is almost equal to the height of the lower cover 420. Consequently, the inverter device 43 can be cooled down and the power conversion apparatus 200 can be limited in height.

As shown in FIG. 6, the inlet and outlet pipes 13 and 14 of cooling water are fastened to each other with screws. In the state shown in FIG. 6, the water leak test can be carried out for the cooling water path 19. When the water path 19 passes this leak test, the auxiliary inverter device 43, then the capacitor module 500 described above are fastened to the path 19 respectively.

Figure 7A:
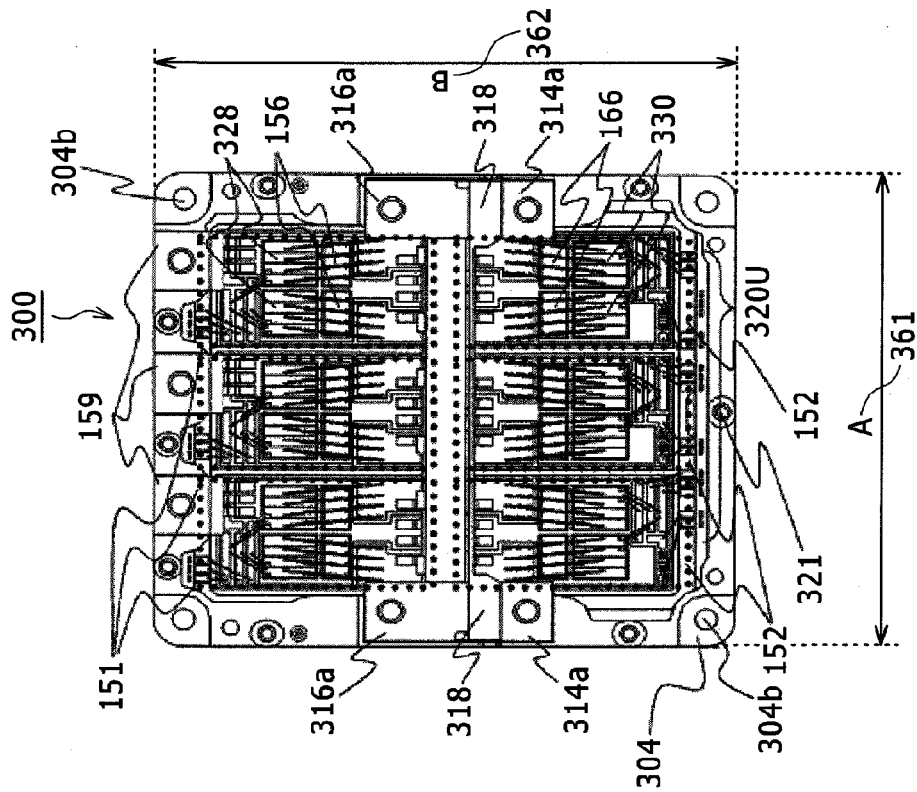
FIG. 7A is a perspective top view of a power module in the embodiment of the present invention.
Figure 7B:
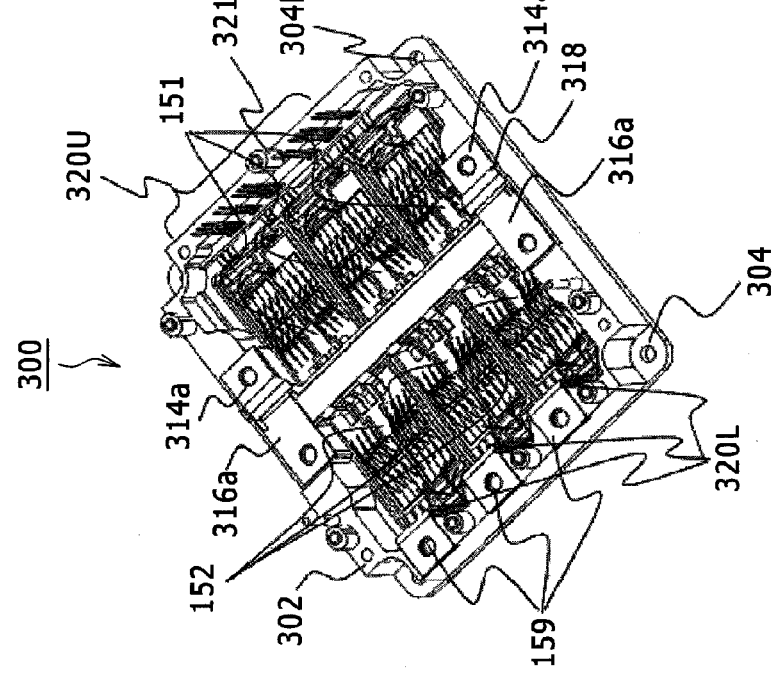
FIG. 7B is a top view of the power module.
Figure 8:
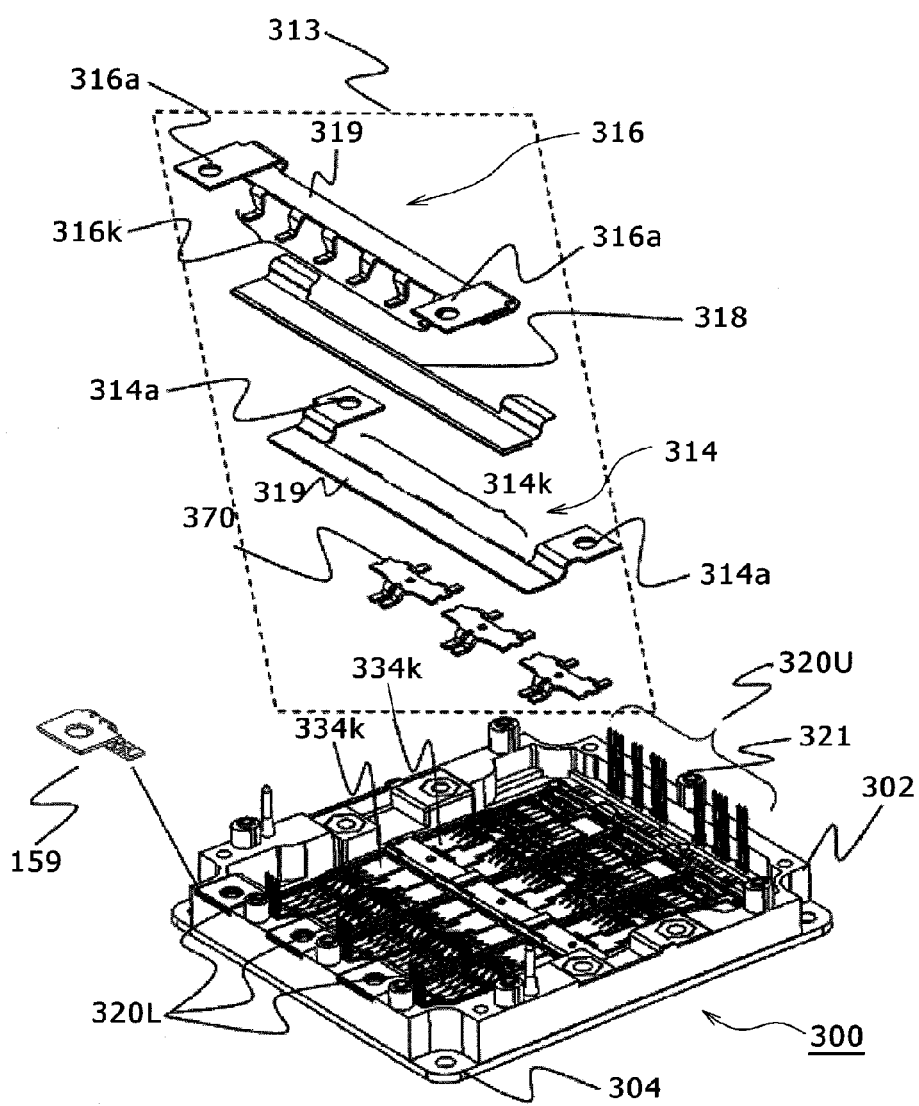
FIG. 8 is an exploded view of a voltage phase correcting and guiding unit 10.
Figures 9A, 9B:
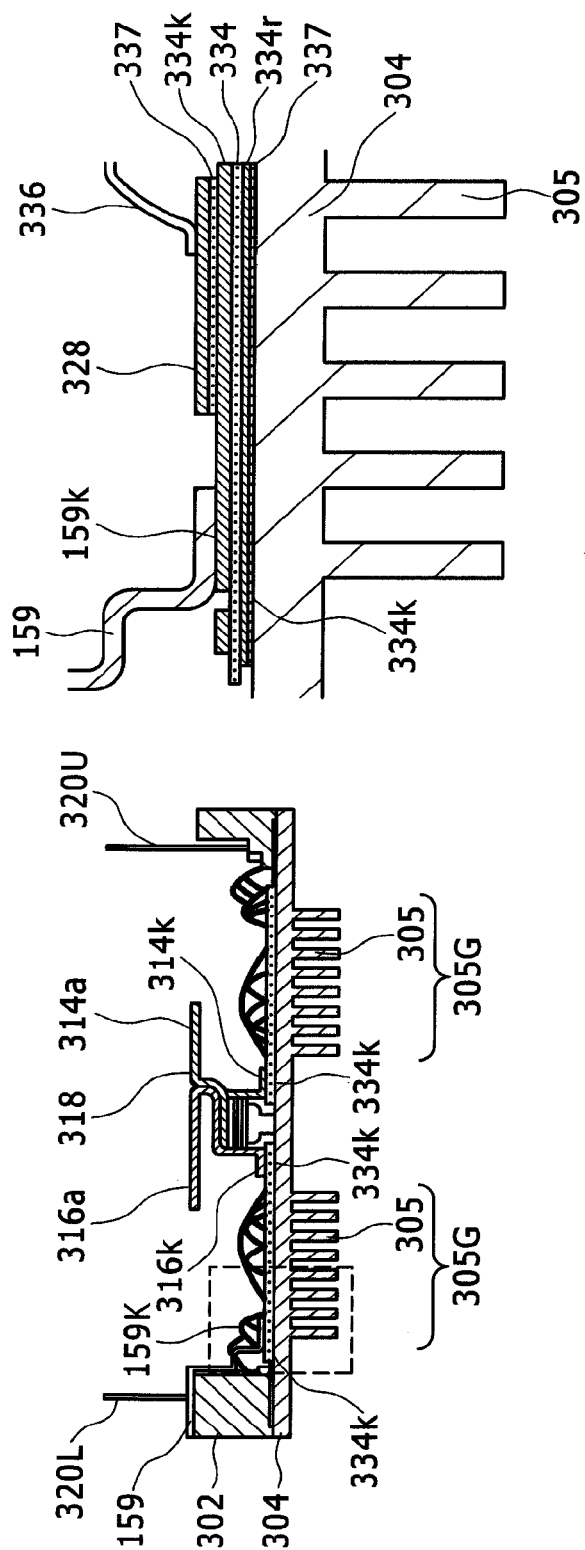
FIG. 9A is a cross sectional view of the power module.
FIG. 9B is an expanded view of a section enclosed by a dotted line in FIG. 9A.

FIG. 7A is a top perspective view of the power module in this embodiment and FIG. 7B is a top view of the power module 300. FIG. 8 is an exploded perspective view of the DC terminal of the power module 300 in this embodiment. FIGS. 9A and 9B are cross sectional views of the power module 300 and FIG. 10A is a top perspective view of a metal base 304 of the power module 300 and one of the three upper and lower arms serial circuits. FIG. 10B is an exploded perspective view of a metal base 304, a circuit wiring pattern, and an insulated substrate 334.

In FIGS. 7A and 7B, the reference numerals are defined as follows; 302 denotes a power module case, 304 denotes a metal base, 314a denotes a DC positive polarity terminal connection part, 316a denotes a DC negative polarity terminal connection part, 318 denotes an insulation sheet (see FIG. 8). And 320U/320L denotes a power module control terminal, 328 denotes an upper arm IGBT, 330 denotes a lower arm IGBT, and 156/166 denotes a diode.

Each power module 300 consists mainly of a semiconductor module block, which includes a wiring in the power module case 302 made of a resin material; a metal base 304 made of such a metallic material as Cu, Al, AlSiC, or the like; and external connection terminals (the DC positive polarity terminal 314, the control terminal 320U, etc.). As such external connection terminals, the power module 300 includes U-phase, V-phase, and W-phase AC terminals 159 connected to a motor, as well as a DC positive polarity terminal 314 and a DC negative polarity terminal 316 connected to the capacitor module 500 (see FIG. 8), respectively.

The semiconductor module includes IGBTs 328 and 330 of the upper and lower arms, the diodes 156 and 166, etc. provided on the insulated substrate 334 and the module is protected by resin or silicon gel (not shown). The insulated substrate 334 may be replaced with a ceramic substrate or a thinner insulation sheet. 321 denotes a boss for fastening the driving circuit board 22 (shown in FIG. 4). 304b denotes a screw hole for connecting the power module 300 (shown in FIG. 4) to the fastening surface 410S (shown FIG. 5B) with a screw (not shown).

FIG. 7B illustrates concretely how the upper/lower arm serial circuit is disposed on the insulated substrate 334 made of ceramic having high thermal conductivity and fastened to the metal base 304, as well as how they are configured respectively. In FIG. 7B, two chips, each consisting of an IGBT 328/330 and a diode 156/166, are connected in parallel to configure the upper and lower arms, thereby increasing the current to be flown to those upper and lower arms. 321 denotes a boss for fastening the driving circuit board 22 (shown in FIG. 4). 304b denotes a screw hole for connecting the power module 300 (shown in FIG. 4) to the fastening surface 410S (shown FIG. 5B) with a screw (not shown). Each of "A" and 361 denote a width of the power module 300. Each of "B" and 362 denote a depth of the power module 300.

As shown in FIG. 8, the DC terminal 313 built in the power module 300 has a laminated structure consisting of the DC negative polarity terminal 316 and the DC positive polarity terminal 314 (enclosed by a dotted line in FIG. 8) with the insulation sheet 318 therebetween. The end parts of the DC negative and positive polarity terminals 316 and 314 are bent in the directions opposite to each other to form a DC negative and positive polarity connection parts 316a and 314a used for connecting the laminated conductor board 700 to the power module 300 electrically. Because two connection parts 314a and two connection parts 316a are provided in such a way, the average distance between each of the negative and positive polarity connection parts 316a and 314a and each of the three upper/lower arm serial circuits becomes almost equal. Thus the variation of the parasitic inductance in the power module 300 can be reduced.

When the DC positive polarity terminal 314, the insulation sheet 318, and the DC negative polarity terminal 316 are laminated, the negative and positive polarity connection parts 316a and 314a are bent in the directions opposite to each other. The insulation sheet 318 is bent along the negative polarity connection part 316a to secure the insulated creepage surface distances of the positive and negative polarity terminals. The insulation sheet 318, when heat resistance is required, uses a composite sheet made of polyimide, meta-aramid fiber, tracking property improved polyester, etc. Two insulation sheets may be laminated to improve the reliability and prevent such defects as pin holes, etc. Furthermore, in order to prevent the insulation sheet 318 from rents and tears, the corners are rounded. And the sagging face generated when in die-cutting is faced towards the insulation sheet 318 so that the terminal edge does not touch the insulation sheet 318. Although such an insulation sheet is used as an insulator in this embodiment, the terminal may be coated with an insulation material. And in order to reduce the parasitic inductance, for example, when the power module has a withstand voltage of 600 V, the distance between the positive and negative poles is set at 0.5 mm or under and the thickness of the insulation sheet is set at a half of the current one or under.

The DC positive and negative polarity terminals 314 and 316 include connection ends 314k and 316k to be connected to the circuit wiring pattern 334k on the insulated substrate 334, respectively. Two connection ends 314k and two connection ends 316k are provided for each of the phases (U, V, and W). Consequently, as to be described later, a circuit wiring pattern having two small loop current paths can be connected to each phase arm. Each of the connection ends 314k and 316k is protruded towards the circuit wiring pattern 334k and its tip is bent to form a coupling surface with respect to the circuit wiring pattern 334k. While each of the connection ends 314k and 316k is soldered to the circuit wiring pattern 334k or both of the metals are welded directly by ultrasonic wave.

The power module 300, particularly the metal base 304 swells or shrinks according to the temperature cycle. This swelling and shrinking might cause cracks or breaks at the connection part between the connection end 314k/316k and the circuit wiring pattern 334k. In order to prevent this, the power module 300 in this embodiment, as shown in FIGS. 9A and 9B, is structured so that the laminated top surface 319 formed by laminating the DC positive and negative polarity terminals 314 and 316 comes to be disposed approximately in parallel to the plane of the metal base 304 at the side where the insulated substrate 334 is disposed. Consequently, the laminated plane 319 can be warped corresponding to the warping of the metal base 304, which is caused by the swelling and shrinking described above. Therefore, the rigidity of the connection ends 314k and 316k formed unitarily with the laminated plane 319 can be reduced with respect to the warping of the metallic base 304. This eases the stress to be applied vertically to the coupling surface between the connection end 314k/316k and the circuit wiring pattern 334k, thereby cracks or breaks that might otherwise occur at this coupling surface can be prevented.

The length of the laminated plane section 319 is set at 130 mm in the width direction and at 10 mm in the depth direction so that the length in the depth direction is slightly increased to warp corresponding to the warping of the metal base 304 in both the width and depth directions. The thickness of the laminated plane section 319 of each of the DC positive and negative polarity terminals 314 and 316 is set as comparatively thin as 1 mm so as to enable the DC positive and negative polarity terminals 314 and 316 to warp easily. 321 denotes a boss for fastening the driving circuit board 22 (shown in FIG. 4).

As shown in FIGS. 9A and 9B, the metal base 304 has fins 305 at the opposite side of the insulated substrate 334 so as to release the heat efficiently into the cooling water flowing in the cooling water path 19. The metal base 304 has an IGBT and a diode used to configure an inverter circuit on its one surface and a resin-made power module case 302 at its outer periphery. On the other surface of the metal base 304, the fins 305 are soldered and protruded, respectively. The metal base 304 and the fins 305 may be cast into one. This manufacturing method can improve the productivity of the power module 300, the thermal conductivity from the metal base 304 to the fins 305, and the heat releasing performance of the IGBT and the diode. In addition, if the metal base 304 is made of a material having a Vickers hardness of Hv 60 and over, the ratchet deformation of the metal base 304 to be caused by the temperature cycle is suppressed, thereby the property of sealing between the metal base 304 and the apparatus casing 12 is improved. Furthermore, as shown in FIG. 9A, two pairs of fin groups 305G are provided for each of the upper and lower arms and those fin groups 305G are formed so as to be protruded into the circulating cooling water path 19 through the openings 400 and 402 of the path 19. The metallic surface around the fin groups 305G of the metal base 304 functions to close the openings 400 and 402 provided for the cooling jacket 19.

In this embodiment, the fins 305 are shaped like pins. Those fins may also be straight type fins formed in the flowing direction of the cooling water. If the straight type fins are employed for the fins 305, the cooling water pressure can be lowered. On the other hand, employment of pin type fins will improve the cooling efficiency.

On one side surface (the upper side surface in the figure) of the metal base 304 is fastened the insulated substrate 334 and on the insulated substrate 334 are soldered (337) a chip having the IGBT 328 and the diode 156 of the upper arm and the IGBT 330 and the diode 166 of the lower arm, respectively. At the back side of the insulated substrate 334, that is, on the opposite side surface of the circuit wiring pattern formed surface is formed a solid pattern 334r in which no circuit pattern is formed. The solid pattern 334r on the back surface of the insulated substrate 334 is soldered (337) to the metal base 304. 159k denotes a connection portion connected with the AC terminal 159 in the circuit wiring pattern 334k.

As shown in FIG. 10A, the upper/lower serial circuit 150 includes an upper arm circuit 151, a lower arm circuit 152, a terminal 370 that connects those upper and lower circuits 151 and 152 to each other, and an AC terminal 159 that outputs an AC power. And as shown in FIG. 10B, the upper arm circuit 151 is formed by providing an insulated substrate 334 having a circuit wiring pattern 334k on the metal base 304 and by mounting the IGBT 328 and the diode 156 on the circuit wiring pattern 334k.

Each of the IGBT 328 and the diode 156 has an electrode provided on its back side and soldered to the circuit wiring pattern 334k. Similarly to the upper arm circuit, the lower arm circuit 152 also includes an insulated substrate 334 disposed on the metal base 304, a circuit wiring pattern 334k wired on the insulated substrate 334, and the IGBT 330 and the diode 166 mounted on the circuit wiring pattern 334k.

The electrode at the back side of each of the IGBT 330 and the diode 166 is also soldered to the circuit wiring pattern 334k. In this embodiment, each phase arm consists of two pairs of circuit blocks, each having the IGBT 328 and the diode 156 that are connected to the object in parallel. The required number of circuit blocks is determined by the current flow to the motor 192. In this embodiment, if the required current flow is larger than that of the motor 192, three or more pairs of the circuit blocks are connected in parallel. On the contrary, if the required current flow is smaller than that of the motor 192, each phase arm can be configured only by one pair of circuit blocks. Each of 304a and 304b denotes a screw hole for connecting the power module 300 (shown in FIG. 4) to the fastening surface 410S (shown FIG. 5B) with a screw (not shown).

Next, there will be described the current flow path of the power module 300 with reference to FIG. 10B. The current flows to the upper arm circuit 151 of the power module 300 as follows: (1) from the DC positive polarity terminal 314 (not shown) to the connection conductor part 371U, (2) from the connection conductor part 371U to the electrode of one of the upper arm IGBT 328 and the upper arm diode 156 (the electrode connected to the element side connection conductor part 372U) through the element side connection conductor part 372U, (3) from the electrode of the other one of the upper arm IGBT 328 and the upper arm diode 156 to the connection conductor part 373U through a wire 336, and (4) from the connection conductor part 373U to the connection conductor part 371D through the connection part 374U/374D of the wiring terminal 370.

As described above, the upper arm consists of two pairs of circuit blocks, in each of which the IGBT 328 and the diode 156 are connected to the object in parallel. Consequently, in the current path of (2), the current is branched into two by the element side connection conductor part 372U and flown into those two pairs of the circuit blocks.

The current path to the lower arm 152 of the power module 300 will be as follows:

(1) from the connection conductor part 371D to the electrode of one of the electrodes of the lower arm IGBT 330 and the upper arm diode 166 (the electrode connected to the element side connection conductor part 372D) through the element side connection conductor part 372D, (2) from the diode of the other one of the lower arm IGBT 330 and the lower arm diode 166 to the connection conductor part 373D through the wire 336, and (3) from the connection conductor part 373D to the DC negative polarity terminal 316 (not shown). Similarly to the upper arm, the lower arm consists of two pairs of circuit blocks, in each of which the IGBT 330 and the diode 166 are connected to the object in parallel. Therefore, in the current path in (1), the current is branched into two by the element side connection conductor part 371D and flown into those two pairs of the circuit blocks.

The connection conductor part 371U that connects the upper arm circuit IGBT 328 (and the diode 156) to the DC positive polarity terminal 314 (not shown) is disposed around the center of one side of the insulated substrate 334. The IGBT 328 (and the diode 156) is mounted around the opposite side of the insulated substrate 334, where the 371U is disposed. In this embodiment, the two connection conductor parts 373U are disposed serially with the above described connection conductor part 371U therebetween and at one side of the insulated substrate 334.

The circuit patterns and the packaging patterns as described above, that is, the circuit wiring patterns on the insulated substrate 334 are formed as approximately T-letter wiring patterns respectively and two wiring patterns (373U) are formed at both sides of an approximately vertical bar (371U). Then, terminals are led from the connection ends 371U and 373U to form an M-letter-like current path as shown with an arrow 350 in FIG. 10B, that is, two small loop current paths (the arrow denotes the path assumed when the lower arm is turned on). A magnetic field 350H is generated around these two small loop current paths in the direction of the arrow 350H (solid line). This magnetic field 350H induces an inductive current, that is, an eddy current 340 to the metal base 304 disposed under the insulated substrate 334. This eddy current 340 generates a magnetic field 340H in the direction in which the above described magnetic field 350H is negated, thereby the parasitic inductance generated in the upper arm circuit is reduced.

The two small loop current flows described above are two U-turn current flows that compete to negate each other when flowing on the insulated substrate 334. Consequently, as shown in the magnetic field 350H in FIG. 10B, a smaller loop magnetic field is generated in the power module 300, thereby the parasitic inductance is reduced. Furthermore, the magnetic loop to be generated at a switching timing is so small and it is closed in the power module, so the inductive current to the apparatus casing 12 outside the power module 300 is reduced, thereby the control circuit board is prevented from malfunctions and the magnetic nose that otherwise leaks outside the power conversion apparatus 200 can be prevented.

The lower arm circuit also has circuit wiring patterns and packaging patterns just like those of the upper arm circuit described above. In other words, the connection conductor part 371D that connects the lower arm circuit IGBT 330 (and the diode 166) to the DC negative polarity terminal 316 (not shown) is disposed around a middle point at one side of the insulated substrate 334. The IGBT 330 (and the diode 166) are mounted near the other side of the insulated substrate 334 where the connection conductor part 371D is disposed. In this embodiment, the two connection conductor parts 373D are disposed serially with the connection conductor part 371D therebetween and at one side of the insulated substrate 334.

Because the circuit wiring patterns and the packaging patterns are employed and disposed in such a way, the parasitic inductance as described above is reduced even at the lower arm circuit side. In this embodiment, for example, the inlet of each phase arm current path becomes the connection conductor part 371U disposed between two connection conductor parts 373U. Even when the positions of the inlet and outlet are exchanged, the small loop current path as described above is formed in each phase arm. Consequently, just like in the above case, each phase arm parasitic inductance is reduced and the magnetic noise generation is prevented.

Figure 11:
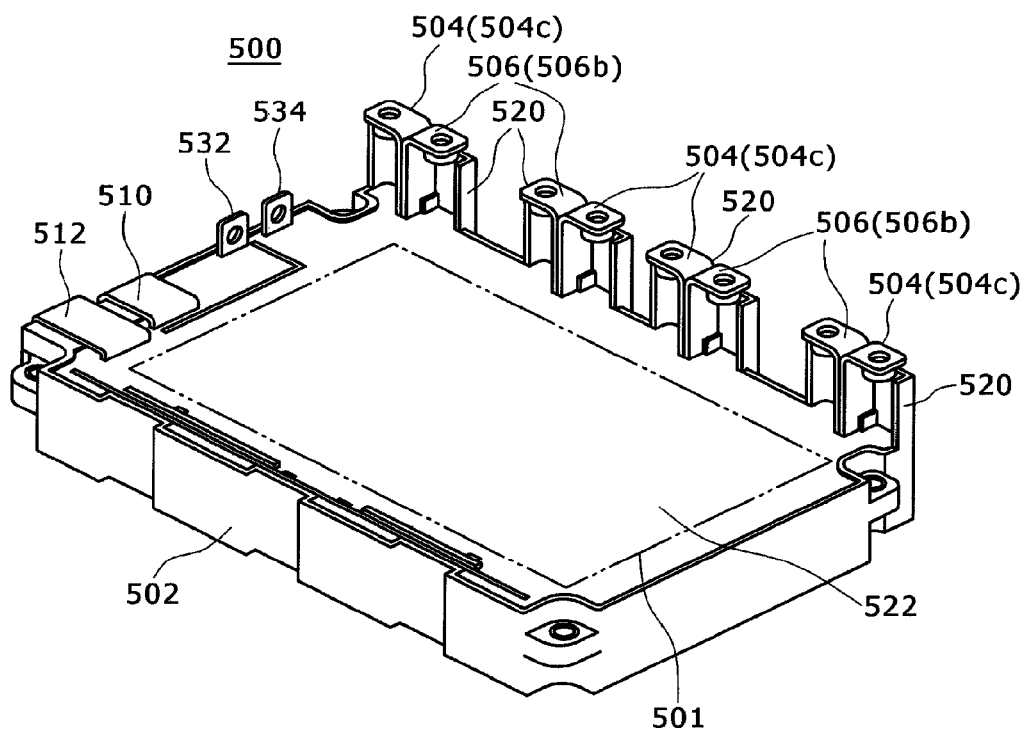
FIG. 11 is a perspective inside view of a capacitor module.
Figure 12:
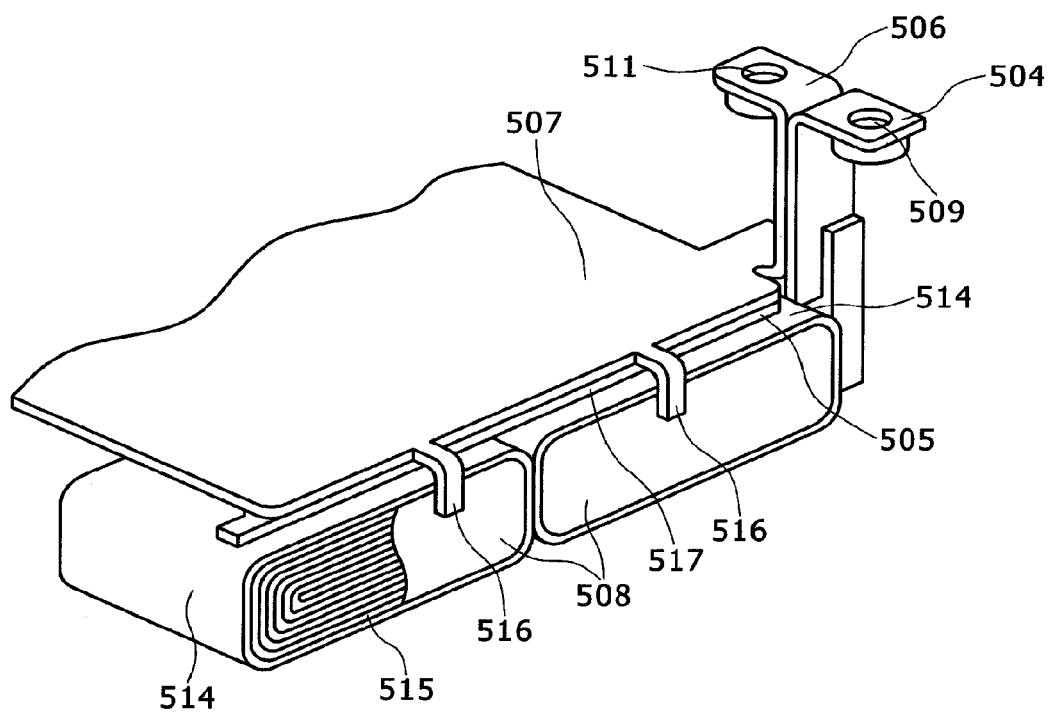
FIG. 12 is a partial inside view of a mold of the capacitor module.

Next, there will be described in detail the structure of the capacitor module 500 in this embodiment with reference to FIGS. 11 and 12. FIG. 11 is a perspective outside view of the capacitor module 500. FIG. 12 illustrates part of the inside structure of the capacitor module 500 shown in FIG. 11.

In the capacitor case 502 are provided a plurality of capacitor cells 514 and a laminated wiring board 501. Furthermore, such a filler 522 as resin is filled in the case 502. In FIG. 11, the laminated wiring board 501 buried in the filler 522 is denoted with a two-dot chain line. The plurality of capacitor cells 514 are all provided under the laminated wiring board 501 and connected to the board 501 in parallel. As shown in FIG. 12, a capacitor cell 514, which is a unit structure of the power charger of the capacitor module 500, consists of a film capacitor 515, which is formed by laminating two metal (e.g., aluminum)-evaporated films on its one side and coil them. The laminated two films function as a positive pole and a negative pole respectively. The shaft end surfaces of the rolled laminated films function as a positive electrode and a negative electrode 508 respectively. Those electrodes are manufactured by spraying such a conductive material 508 as tin thereon.

As shown in FIG. 12, the laminated wiring board 501 is formed by laminating negative and positive polarity conductor boards 505 and 507 with an insulation sheet therebetween.

The conductor boards 505 and 507 are made of a thin plate-like wide conductor respectively. This structure of those conductor boards is effective to reduce the parasitic inductance of the laminated wiring board 501. The insulation layer between the negative and positive polarity conductor boards 505 and 507 may not be necessarily the insulation sheet 517. For example, the negative and positive polarity conductor boards 505 and 507 may be molded with an insulation material such as resin or rubber so that an insulation layer is formed between them.

Each of the negative and positive polarity conductor boards 505 and 507 of the laminated wiring board 501 is provided with a terminal 516 to be connected to the positive and negative polarity electrodes 508 of the corresponding capacitor cell 514. The negative polarity terminal is connected to the electrode 508 at the opposite side of the electrode 508 to which the positive polarity terminal 516 is connected (not shown in FIG. 12). The terminals 516 are soldered or welded to the electrodes 508.

The negative and positive polarity conductor boards 505 and 507 are provided with a plurality of negative polarity side capacitor terminals 504 and a plurality of positive polarity side capacitor terminals 506 respectively, which are formed by bending their thin-plate-like wide conductor ends upward respectively. Those negative and positive polarity side capacitor terminals 504 and 506 are connected to the laminated conductor board 700. And as shown in FIG. 11, the negative and positive polarity conductor boards 505 and 507 are provided with DC negative and positive polarity side connection terminals 510 and 512 to be connected to a terminal that receives the battery power, as well as auxiliary machine positive and negative polarity terminals 532 and 534 used for supplying a power to the power module of the auxiliary inverter device 43. The four pairs of capacitor terminals 504 and 506 have openings 509 and 511 and nuts are welded to the back sides of the openings 509 and 511 respectively so as to fasten the DC negative and positive polarity terminals 316 and 314 of the power module 300 with bolts.

The capacitor case 502 has a terminal cover 520 and it is used to position terminals and to be insulated from the casing 12 of the power conversion apparatus 200. In addition, the capacitor case 502 has a partition used to position each of the capacitor cells 514. The capacitor case 502 is made of a material having excellent thermal conductivity. A heat releasing material having an excellent thermal conductivity may be buried in the above described partition.

The capacitor module 500 generates a heat when a ripple current flows therein at a switching time due to the electrical resistance of the metal thin film evaporated on the film provided inside each capacitor cell 514, and due to that of the inner conductor (terminal). Each of the capacitor cells and the inner conductors (terminals) are impregnated (molded) with resin (filler 522) in the capacitor case 502 so as to protect the capacitor cells from humidity. Consequently, those capacitor cells 514 and inner conductors come closely in contact with the capacitor case 502 with resin therebetween, thereby the heat generated by the capacitor cells are easily transmitted to the capacitor case. In addition, this structure makes it possible to transmit the heat generated by the capacitor cells 514 directly to the negative and positive polarity conductor boards 505 and 507, since the negative and positive polarity conductor boards 505 and 507 are connected directly to the electrodes 508 and the terminals 516 and 518 of the capacitor cells 514. As a result, the wide conductors can transmit the heat to the mold resin easily. This is why the heat is transmitted properly from the capacitor case 502 to the apparatus casing 12, further to the cooling water path 19, so that the heat releasing efficiency is improved.

Because all the capacitor cells 514 are connected to the laminated wiring board 501, which is a wide conductor board, in this embodiment, the number of wiring parts is reduced, the productivity is improved, and the electrostatic capacity is approximately averaged among those capacitor cells 514. Thus the operating lives of all the parts of the capacitor module 500 can be extended. Furthermore, the use of the wide conductor board can reduce the parasitic inductance described above.

FIG. 13A is a perspective view of the power conversion apparatus 200 in this embodiment with respect to only the capacitor module 500, the laminated conductor board 700, and the two power modules 300. FIG. 13B is an exploded perspective view of the laminated conductor board 700.

As shown in FIG. 13A, the two power modules 300 are provided in parallel so that their AC terminals 159 are disposed at their minus sides respectively. At the opposite side of those AC terminals 159, an electrical connection part is provided between each of the two power modules and the capacitor module 500. The laminated conductor board 700 provided on a flat board is used for the electrical connection between each of the two power modules 300 and the capacitor module 500.

In the capacitor case 502 fastened on the lower case 16 are housed many capacitor cells 514 (not shown). And the positive and negative polarity side capacitor terminals 504 and 506 of the capacitor module 500 are disposed along one long side of the capacitor case 502. Each of the positive and negative polarity connection parts 504c and 506b at the top ends of the positive and negative polarity side capacitor terminals 504 and 506 are disposed so as to be protruded from the top surface of the corresponding capacitor cell 514.

The laminated conductor board 700 connected to the two power modules 300 is disposed so as to cover those two power modules 300. The positive and negative polarity side capacitor terminals 504 and 506 are shaped like the L-letter respectively; they rise up from the openings of the capacitor case 502. The positive and negative polarity connection parts 506c and 504c at the top ends of the positive and negative polarity side capacitor terminals 504 and 506 formed like the L-letter respectively come in contact with the laminated conductor board 700 and bolted to the board in an assembling process of the power conversion apparatus 200. 321 denotes a boss for fastening the driving circuit board 22 (shown in FIG. 4). 390 denotes a connection point 390 provided in the laminated conductor board 700.

As shown in FIG. 13B, this laminated conductor board 700 consists of flat-plate-like positive and negative polarity side conductor boards 702 and 704, as well as an insulation sheet 706 disposed between those conductor boards 702 and 704. This means that the laminated conductor board 700 has a laminated structure, which can reduce the parasitic inductance in a route from each power module 300 to the capacitor module 500.

As shown in FIG. 13A and FIG. 7B, the plurality of upper arm control terminals 320U are disposed closer to the midpoint of the A side (see FIG. 7B) of the power module 300. In other words, the U-phase control pin is disposed closely to the V-phase control pin and the W-phase control pin is disposed closely to the V-phase control pin, so that the upper arm control terminals 320U come to be disposed in a line around the midpoint of the A side of the power module 300. In addition, the laminated conductor board 700 has a plurality of through-holes 705 through which the plurality of the upper arm control terminals 320U are passed. Even at both sides of each of these through-holes 705 are laminated the positive and negative polarity side conductor boards 702 and 704. These structures are effective to widen the laminated area between the negative and positive polarity side conductor boards 704 and 702. Furthermore, those structures are also effective to reduce the parasitic inductance in a route from each power module 300 to the capacitor module 500.

A boss 321 is disposed around the midpoint of the A side of each power module 300 shown in FIG. 7B, that is, around the upper arm control terminal 320U. The driving circuit board 22 having the driver circuit 174 is fastened to this boss 321 and the upper arm control terminal 320U is passed through the hole formed in the driving circuit board 22. After this, the terminals on the driving circuit board 22 are connected to the arm control terminals 320U, for example, by welding. This structure is effective to improve the vibration resistance at the connection between each of the upper arm control terminals 320U and each of the terminals on the driving circuit board 22 while the subject vehicle is running, since the connections come to be positioned closely to the boss 321.

The driving circuit board 22 is disposed above the laminated conductor board 700. As shown in FIG. 13B, the laminated conductor board 700 has a negative polarity side conductor board 704 closer to the driving circuit board 22 and a positive polarity side conductor board 702 closer to the power module 300. Consequently, the low voltage negative polarity side conductor board 704 and the insulation sheet 706 come to be positioned between the high voltage positive polarity side conductor board 702 and the driving circuit board 22, thereby the driving circuit board 22 is prevented from being exposed to a high voltage.

As shown in FIG. 13B, the positive polarity side conductor board 702 is disposed above and across the two power modules 300 and connects those two power modules 300 to the capacitor module 500 by wiring. Similarly, the negative polarity side conductor board 704 is disposed above and across the two power modules 300 and connects those two power modules 300 to the capacitor module 500 by wiring. Consequently, the laminated conductor board 700 comes to have a wide shape, so that the parasitic inductance in a route from each of the power modules 300 to the capacitor module 500 is reduced effectively. And because there are four pairs of connections provided for the capacitor module 500 with respect to one power module 300, the parasitic inductance can be reduced effectively. Furthermore, because the connection conductor from the two power modules 300 to the capacitor module 500 can be used commonly between the two power modules 300, the total number of the parts of the power conversion apparatus 200 can be reduced and the apparatus productivity is improved.

As shown in FIGS. 7A and 7B, each power module 300 uses two pairs of connection parts 314a and 316a, which are positive and negative polarity connection parts; one pair is disposed at one side and the other pair is disposed at the other side of the power module 300. The laminated conductor board 700 is disposed above and across those two pairs of the connection parts 314a and 316a and connected to them with bolts. Consequently, the DC current supplied from the capacitor module 500 cannot be concentrated only to one pair of the connection parts 314a and 316a; the DC current comes to be dispersed to the two pairs of the connection parts 314a and 316a. Thus the inductance in the route from each power module 300 to the capacitor module 500 is reduced.

As described above, the capacitor module 500 includes a plurality of built-in capacitor cells 514. The capacitor module 500 also includes wide conductors (positive and negative polarity conductor boards 507 and 505) corresponding each pair of those capacitor cells 514. In this embodiment, all those negative and positive polarity side capacitor terminals 504 and 506 are connected electrically to one pair of laminated conductor boards 700. Consequently, all the capacitor cells 514 come to be connected electrically to the two power modules 300, thereby the electrostatic capacitor can be used almost equally among those capacitor cells 514. The operation lives of all the parts of the capacitor module 500 can thus be extended. 702a denotes a screw hole for connecting the positive polarity side conductor board 702 to the DC positive polarity terminal connection part 314a with a screw. 702b denotes a screw hole for connecting the positive polarity side conductor board 702 to the positive polarity side capacitor terminal 506 with a screw. 704a denotes a screw hole for connecting the negative polarity side conductor board 704 to the DC negative polarity terminal connection part 316a. 704c denotes a screw hole for connecting the negative polarity side conductor board 704 to the negative polarity side capacitor terminal 314a with a screw. 706 denotes an insulation sheet located between the positive polarity side conductor board 702 and the negative polarity side conductor board 704.

The space between the positive and negative polarity side conductor boards 702 and 704 of each laminated conductor board 700 should preferably be reduced as much as possible to reduce the parasitic inductance described above. For example, if the laminated conductor board 700 includes a bent part for connecting each power modules 300 to the capacitor module 500 by wiring, the bent part requires a larger space than that of the flat plate section. As a result, the parasitic inductance comes to increase.

In order to avoid this, in this embodiment, the positive and negative side connection parts 314a and 316a of each power module 300 and the positive and negative polarity side connection parts 504c and 506b of the capacitor module 500 are disposed approximately on the same plane. The laminated conductor board 700 can thus be formed like a flat board, thereby the space between the positive and negative polarity side conductor boards 702 and 704 can be reduced and the parasitic inductance can be reduced.

FIG. 14A is an expanded view of a connection point 380 between the power module 300 and the laminated conductor board 700 shown in FIG. 13A.

As shown in FIG. 14A, the negative and positive polarity connection parts 316a and 314a are formed by bending the ends of the DC positive and negative polarity terminals 314 and 316 in the opposite direction from each other and the negative and positive polarity side conductor boards 704 and 702 of the laminated conductor board 700 are connected to those negative and positive polarity connection parts 316a and 314a respectively. The negative polarity side current that flows instantaneously at a switching timing of the IGBT 328/330 comes to flow in the current path 382 shown in FIG. 14A, thereby a U-turn current is formed between the connection part 704a of the negative polarity conductor board and the negative polarity side connection part 316a. As a result, the magnetic fluxes generated around the connection part 704a of the negative polarity side conductor board 704 and around the negative polarity side connection part 316s come to negate each other, thereby the inductance is reduced.

On the other hand, the current of the positive polarity conductor board connection part 702a flows in the current path 384 as shown in FIG. 14A. And because a negative polarity conductor board 704 is disposed above this positive polarity conductor board connection part 702a, the current flowing direction of this positive polarity conductor board connection part 702a becomes opposite to that of the negative polarity conductor board 704, thereby the magnetic fluxes generated by those currents come to negate each other. As a result, the parasitic inductance of the positive polarity conductor board connection part 702*a* is reduced.

Furthermore, as shown in FIG. 14A, the insulation paper 318 and the insulation sheet 706 are disposed so as to have areas to be put one upon another in the vertical direction. And if the laminated conductor board 700 is fastened to the negative and positive polarity side connection parts 316*a* and 314*a* with bolts or the like, the insulation paper 318 and the insulation sheet 706 are disposed so as to have areas that are never put between the laminated conductor board 700 and the positive polarity side connection part 314*a*, that is, areas that never receive any compression stress. Therefore, the positive pole and the negative pole can be insulated from each other at the connection part therebetween. Concretely, the insulation is secured between the positive polarity side connection part 314*a* and the negative polarity conductor board 704.

FIG. 14B is an expanded view of the connection point 390 of the laminated conductor board 700 shown in FIG. 13A. As shown in FIG. 14B, the positive and negative polarity side connection parts 506*b* and 504*c* of the capacitor module 500 are bent in the opposite directions from each other and they are connected to the positive and negative polarity side conductor boards 702 and 704 of the laminated conductor board 700 on their top surfaces respectively. Consequently, the negative polarity side current that flows instantaneously at a switching time of the IGBT 328/330 comes to flow in the current path 392 shown in FIG. 14B, so that a U-turn current is formed between the connection part 704*c* of the negative polarity conductor board 704 and the negative polarity side connection part 504*c* of the capacitor module 500. Consequently, the magnetic fluxes generated around the connection part 704*a* of the negative polarity conductor board 704 and around the negative polarity side connection part 504*c* come to negate each other, thereby the inductance described above is reduced.

Similarly, the positive polarity side current that flows instantaneously at a switching time of the IGBT 328/330 comes to flow in the current path 394 shown in FIG. 14B. This means that a U-turn current is formed between the positive polarity conductor board connection part 702*b* and the positive polarity side connection part 506*b* of the capacitor module 500. Thus the magnetic fluxes generated around the connection part 702*b* of the positive polarity side conductor plate 702 and around the positive polarity side connection part 506*b* come to negate each other, thereby the inductance described above is reduced.

Furthermore, as shown in FIG. 14B, the insulation sheets 517 and 706 are disposed so as to have areas to be overlapped in the vertical direction. And if the laminated conductor board 700 is fastened to the positive and negative polarity side connection parts 506*b* and 504*c* of the capacitor module 500 with bolts or the like, the insulation sheets 517 and 706 are disposed so as to have areas that are never put between the laminated conductor board 700 and the positive polarity side connection part 506*b*, that is, areas that never receive any compression stress. As a result, the positive pole and the negative pole can be insulated from each other at the connection part. Concretely, the insulation is secured between the positive polarity side connection part 506*b* and the negative polarity conductor board 704.

Figure 15:
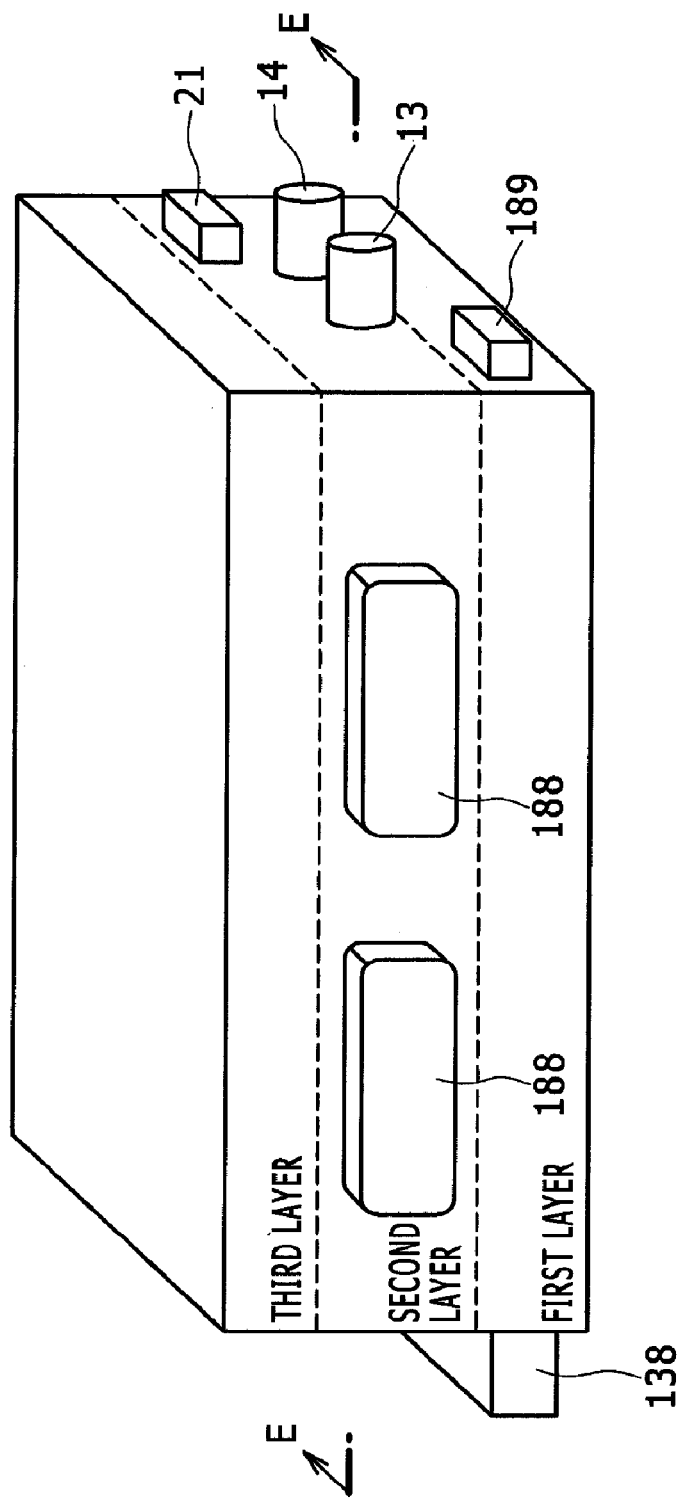
FIG. 15 is an explanatory outside view of the power conversion apparatus 200.

FIG. 15 is an explanatory external view of the power conversion apparatus 200. At one side of the apparatus 200 in the longitudinal direction (right to left in FIG. 15) are provided a cooling water inlet pipe 13, a cooling water outlet pipe 14, a connector 21 for sending/receiving signals to/from external, and an AC connector 189 of the auxiliary inverter device 43.

At the other side of the apparatus 200 in the longitudinal direction are provided a DC connector 138. And at the side surface beforehand are disposed AC connectors 188 used for the inverter devices 140 and 142 respectively. As to be described later, three layers are formed in the casing 12 of the power conversion apparatus 200 and the DC connector 138 and the auxiliary inverter AC connector 189 are disposed at a side outer surface of the first (lowest) and the pipes 13 and 14, as well as the connector 21 and a pair of AC connectors 188 are disposed at side outer surfaces of the second layer.

Figure 16:
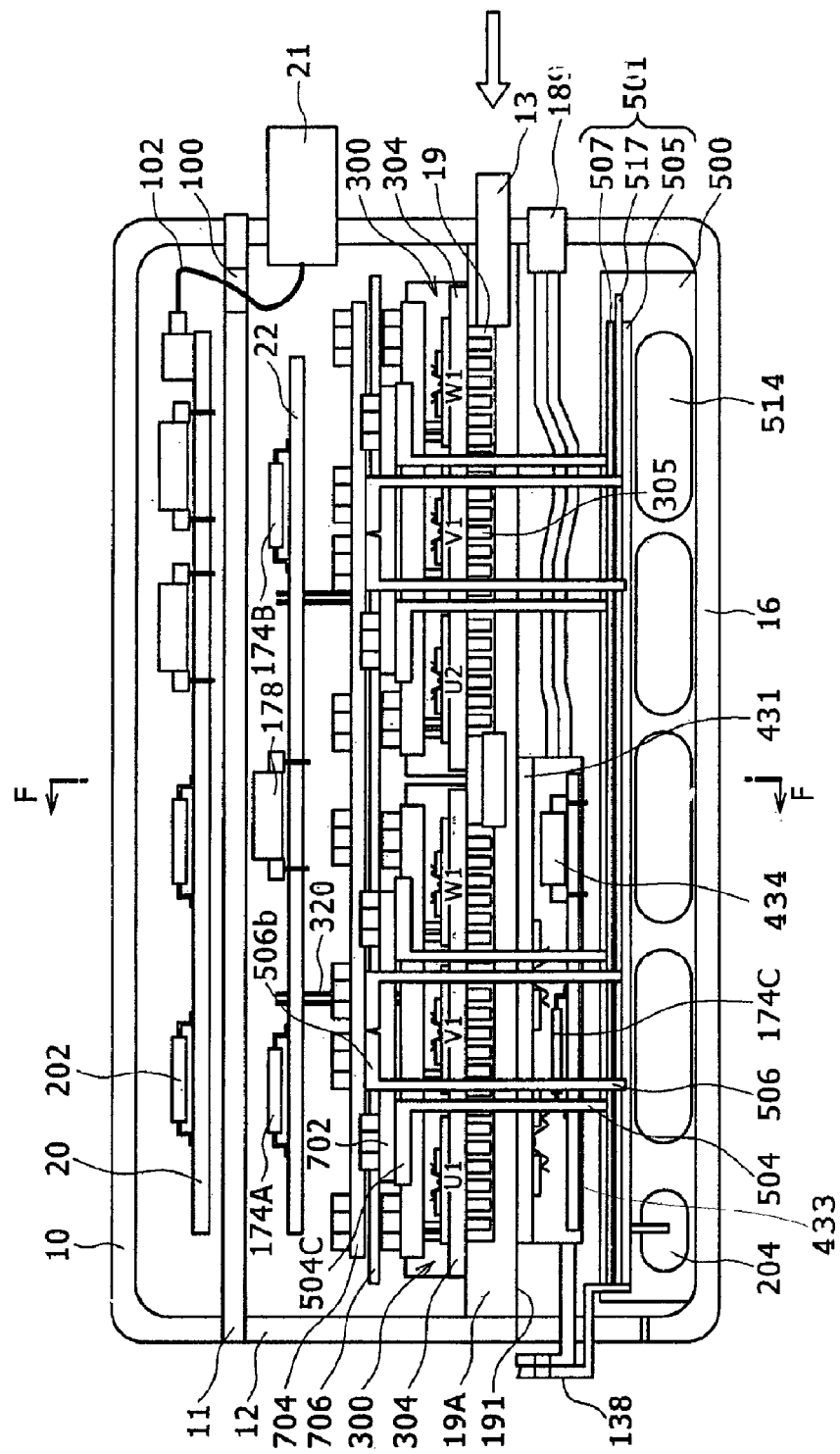
FIG. 16 is a cross sectional view taken on line E-E of FIG. 15.
Figure 17:
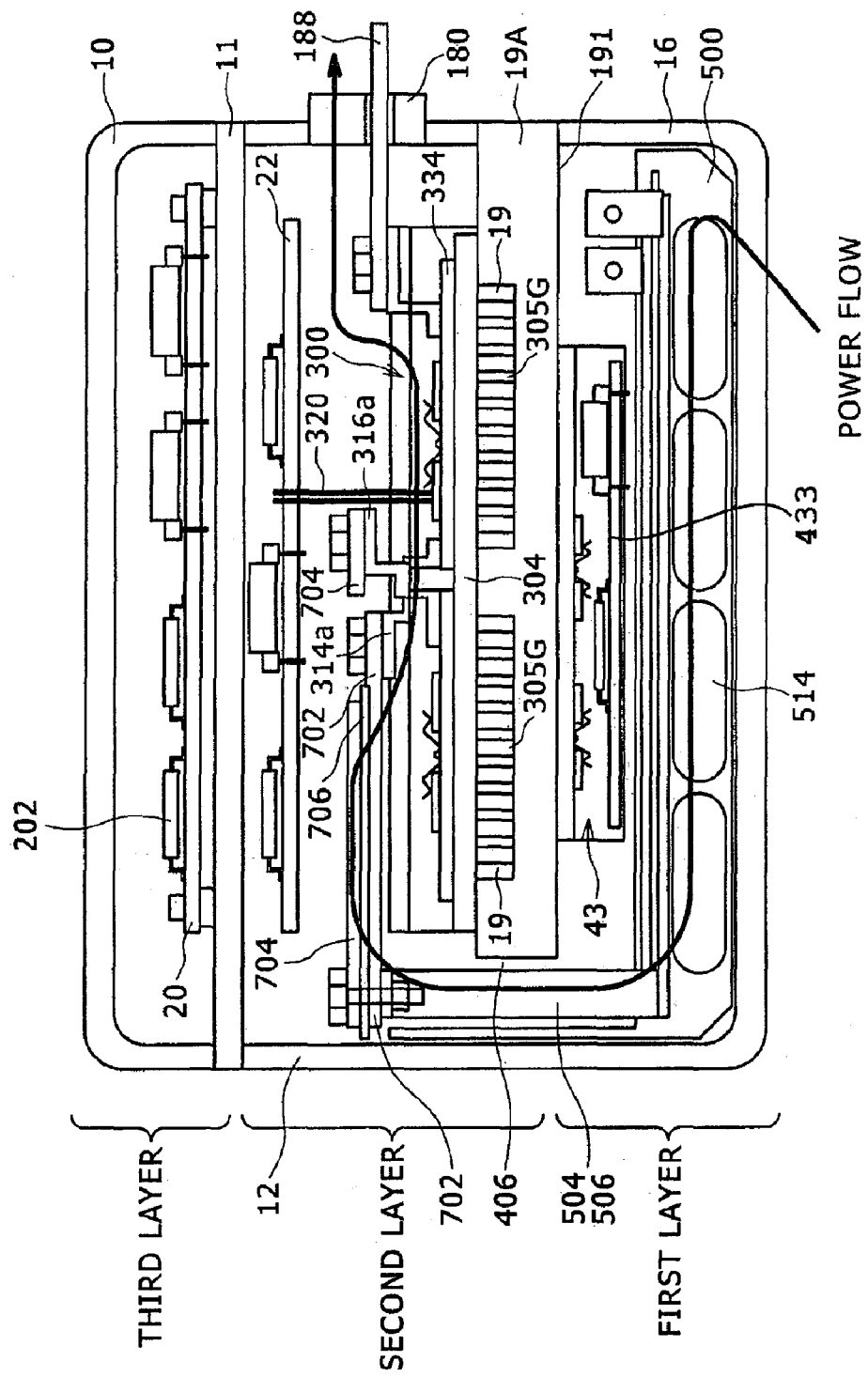
FIG. 17 is a cross sectional view taken on line F-F of FIG. 16.

FIGS. 16 and 17 are cross sectional views of the power conversion apparatus 200. FIG. 16 is a cross sectional view taken on line E-E of FIG. 15, along the going flow of the cooling water. FIG. 17 is a cross sectional view taken on line F-F of FIG. 16, at an almost middle point between two power modules disposed in parallel with respect to the cooling water flow. In FIGS. 16 and 17, the lower side of the cooling jacket provided at a middle place in the apparatus casing 12 comes to be the first (bottom) layer. Part of the cooling jacket 19A, as well as the section between the cooling jacket 19A and the metal base board 11 come to be the second layer. On the third layer are provided the metal base board 11 and the upper case 10 disposed above the metal base board 11. 202 denotes a circuit element located on the control circuit board 20. Each of 174A, 174B and 178 denotes a driving circuit element located on the driving circuit board 22. 320 denotes a control terminal extending from the power module 300 to the driving circuit board 22.

On the first layer, the capacitor module 500 is provided in the lower case 16. The capacitor module 500, as described above, includes a plurality of capacitor cells 514 and a laminated wiring board 501. Under the laminated wiring board 501 is provided the filter 204 shown in FIG. 2. The four pairs of capacitor terminals 504 and 506 provided on the negative and positive polarity conductor boards 505 and 507 of the laminated wiring board 501 rise up vertically from the laminated wiring board 501 and passes through the space (the through-hole 406 shown in FIGS. 5A to 5C) between the cooling jacket 19A and the side wall of the apparatus casing 12 and extended up to the second layer. In the example shown in FIG. 16, the laminated wiring board 501 is disposed above the capacitor cells 514, but they may be disposed under the cells 514. 138 denotes a DC connector extending from the capacitor module 500 to an outside of the apparatus casing 12.

In addition, the power module of the auxiliary inverter device 43 is fastened to the bottom surface of the cooling jacket 19A. Because the cooling jacket 19A is formed unitarily with the apparatus casing 12 in the aluminum casting process, the flowing cooling water cools down the whole cooling jacket 19A. This is why the bottom surface of the cooling jacket 19A can be regarded as a cooling surface. The power module 300 is fastened so that the heat releasing metal base 431 having the inverter semiconductor elements (IGBTs and diodes) faces upward and the metal base 431 comes to closely in contact with the bottom surface 191 of the cooling jacket 19A. The driving circuit board 433 having the driver circuit 174C of the inverter device 43 and the drive power supply 434 mounted thereon is provided under the switching semiconductor elements. 189 denotes the AC connector (shown in FIG. 15) connecting the motor 195.

The power module 300 of each of the inverter devices 140 and 142 is disposed on the top surface of the cooling jacket 19A, that is, on the second layer of the apparatus casing 12. The power modules 300 are disposed side by side in the flowing direction of the cooling water, that is, in the right-left direction in FIG. 16. In FIG. 16, on the left side is disposed the power module 300 of the inverter device 140 and on the right side is disposed the power module 300 of the inverter device 142. The metal base 304 of each power module 300 is fastened onto the cooling jacket 19A so as to face the upper side of the apparatus casing 12. The plurality of fins (pin fins) 305 formed on the bottom surface of the metal base 304 are protruded into the cooling path 19. On each metal base 304 are disposed the elements of the U, V, and W phases side by side vertically at the side of the upper arm with the insulated board 334 therebetween respectively in the right-left direction in FIG. 16.

Around a middle point of the vertical direction at a cross sectional view of the apparatus casing 12 is provided the cooling jacket 19A that is formed unitarily with the apparatus casing 12 in an aluminum die-casting process. And a power module 300 is disposed in the opening formed at the top surface of the cooling jacket 19A. Shown on the left side in FIG. 16 is the going flow 19a of the cooling water and on the left side is the returning flow 19b of the cooling water. Above the going and returning flows 19a and 19b are provided the openings as described above. The openings are blocked so as to bridge over both of the going and returning flows 19a and 19b by the metal base 304 that releases the heat generated from each power module 300. The heat releasing fins 305 provided on the metal base 304 are protruded through those openings into the cooling water flow. The inverter device 43 is also fastened to the bottom side of the cooling water path 19.

A flat AC power line of which center part is bent has one end connected to the AC terminal of the power module 300 and the other end protruded from inside the power conversion apparatus 200 to form an AC connector. The positive and negative polarity side capacitor terminals 504 and 506 are connected electrically and mechanically to the positive and negative polarity side conductor boards 702 and 704 through a through-hole 406, respectively. The AC connector 188, the positive and negative polarity side capacitor terminals 504 and 506 are disposed in the vertical direction with respect to the cooling water flow in the cooling water path 19 provided in the apparatus casing 12. Thus the electric wirings come to be laid neatly, thereby the power conversion apparatus 200 can be reduced in size. The positive and negative polarity side conductor boards 702 and 704, as well as the AC side power line 186 of the laminated conductor board 700 are protruded from the power module 300 to form connection terminals respectively. As a result, the electrical connections can be made so easily and because no other connection conductors are used, the power conversion apparatus 200 can be reduced in size. And this structure is also effective to improve the productivity and reliability of the power conversion apparatus 200.

The through-hole 406 is isolated from the cooling water path 19 by a frame body in the apparatus casing 12. And because the connection part between the positive and negative polarity side conductor boards 702 and 704, as well as the connection part between the positive and negative polarity side capacitor terminals 506 and 504 are provided in the through-hole, the reliability of the power conversion apparatus 200 is improved. 504C denotes the positive polarity connection part 504c (shown on FIG. 13A). 702 denotes the positive polarity side conductor boards 702 (shown on FIG. 13A)

In FIG. 17, the arrow line denotes a power flow. The DC power inputted to the power conversion apparatus 200 is inputted to each power module 300 provided on the second layer through the capacitor module 500, the capacitor terminals 504 and 506, and the laminated conductor board 700. The DC power is then converted to an AC power by the power module 300 and outputted from the AC connector 188.

Because the capacitor terminals 504 and 506 are provided so as to pass aside the cooling jacket 19A to connect the capacitor module 500 to the laminated conductor board 700, the power wirings can be formed so as to surround the cooling jacket 19, thereby the power lines can be laid in the shortest route. And because a laminated structure is employed for laying the power wirings, even when the capacitor module 500 and the power module 300 are disposed so as to put the cooling jacket 19A therebetween, the impedance described above can be reduced. Furthermore, because the capacitor module 500 is disposed near the cooling jacket 19A, the cooling efficiency of the capacitor module 500 is improved.

In case of the cooling structure described above, each power module 300 having a large calorific value is fastened to one surface of the cooling jacket 19A and the fins 305 of the power module 300 are protruded into the cooling water path 19 to cool down the power module 300 efficiently. Then, the auxiliary inverter device 43 having a large calorific value is cooled down on the other surface of the cooling jacket 19A. Furthermore, the capacitor module 500 having the next larger calorific value is cooled down through the apparatus casing 12 and the lower case 16. Due to the cooling structure preferred to those calorific values, the cooling efficiency and reliability of the power conversion apparatus 200 are improved and this can reduce the apparatus 200 in size effectively. 334 denotes the insulated substrate (shown in 7A). 320 denotes the control terminal (shown in FIG. 16).

Furthermore, because the inverter device 43 is fastened onto the bottom surface 191 of the cooling jacket 19A, which faces the capacitor module 500, if the capacitor module 500 is used as a smoothing capacitor of the inverter device 43, the wiring distance can be shortened. And when the wiring distance is such short, the inductance described above can also be reduced.

Above the power module 300 is disposed a driving circuit board 22 that includes a driver circuit 174. And above the driving circuit board 22 is disposed a control circuit board 20 with the metal base plate 11 therebetween. The metal base plate 11 improves the heat releasing and electromagnetic shielding effects. The control circuit board 20 mounts a CPU 212, a control power supply, etc. provided for the control circuit 172. The metal base plate 11 has an opening 100 and the signal cable 102 (shown in FIG. 16) led from the signal terminal of the control circuit board 20 is passed through this opening 100 (shown in FIG. 16) and connected to a connector 21 provided on the side wall of the apparatus casing 12. This completes the description of how the power conversion apparatus 200 in this embodiment is configured. 202 denotes the circuit element (shown FIG. 16).

As described above, because the driving circuit board 22 is disposed between the control circuit board 20 and a power module 300, the operation timings of the inverter circuit are transmitted from the control circuit board 20 to the driving circuit board 22. And according to the operation timings, the driving circuit board 22 generates gate signals, which are then applied to the gate of each power module 300. The control circuit board 20 and the driving circuit board 22 are disposed by taking consideration to the electrical connection relationship in such a way, so that the electrical wirings can be simplified and the power conversion apparatus 200 can be reduced in size. And because the driving circuit board 22 is disposed closer to the control circuit board 20 than the power module 300 and the capacitor module 500, the wiring distance from the driving circuit board 22 to the driving circuit board 20 is shorter than that from another component (power module 300, etc.) to the control circuit board 20. Consequently, the electromagnetic noise transmitted from the DC positive polarity side connection terminal 512 and the electromagnetic noise caused by the switching operation of the IGBT 328/330 can be prevented from entering each wiring from the driving circuit board 22 to the control circuit board 20.

And because the power module 300 is fastened to one surface of the cooling jacket 19A and the inverter device 43 is fastened to the other surface thereof, both of the power module 300 and the inverter device 43 can be cooled down by the cooling water flowing in the cooling water path 19 at the same time. In this case, the cooling effect of the power module 300 is more improved, since its heat releasing fins come in contact directly with the cooling water in the path 19. Furthermore, the cooling water in the path 19 also cools down the apparatus casing 12, as well as the lower case 16 and the metal base plate 11 fastened to the apparatus casing 12. And because the metal case of the capacitor module 500 is fastened to the lower case 16, the capacitor module 500 is cooled down by the cooling water through both of the lower case 16 and the apparatus case 12. In addition, the cooling water also cools down the control circuit board 20 and the driving circuit board 22 through the metal base plate 11. The lower case 16 is made of a material having high heat conductivity. And upon receiving the heat generated from the capacitor module 500, the lower case 16 transmits the heat to the apparatus casing 12 so that the transmitted heat is released into the cooling water in the cooling water path 19. And on the bottom surface of the cooling jacket 19A is provided the inverter device 43 having a comparatively small capacity. The inverter device 43 is used for an in-vehicle air conditioner, an oil pump, and another purpose pump. The heat generated from this inverter device 43 is released into the cooling water flowing in the cooling water path 19 through an intermediate frame body of the apparatus casing 12. Because the cooling jacket 19A is provided in the center of the apparatus casing 12 in such a way, the metal base plate 11 is provided on one surface of the cooling jacket 19A, that is, above the cooling jacket 19A, and the lower case 16 is provided on the other surface, that is, under the cooling jacket 19A, the components of the power conversion apparatus 200 can be cooled down appropriately to their calorific values respectively. This makes it possible to dispose those components neatly in order in the power conversion apparatus 200, so the apparatus 200 can be reduced in size.

Although the cooling water path 19 is the first main heat releasing device for the power conversion apparatus 200, the metal base plate 11 is the second main heat releasing device for the apparatus 200. The metal base plate 11 that functions as an electromagnetic shielding device, can also function to transmit the heat received from the control circuit board 20 and the driving circuit board 22 to the apparatus casing 12. The heat is then released into the cooling water flowing in the cooling water path 19.

As described above, the power conversion apparatus 200 in this embodiment employs a heat releasing system, which is a three-layer laminated structure consisting of the metal base plate 11, the cooling water path 19 (cooling jacket 19A), and the lower case 16. Those heat releasing components are disposed in adjacent to their corresponding heat generators (the power module 300, the control circuit board 20, the driving circuit board 22, and the capacitor module 500) respectively in hierarchical layers. On the middle layer of the hierarchical structure, the main heat releasing component (cooling water path 19) is provided and the metal base plate 11 and the lower case 16 are structured so as to transmit the subject heat into the cooling water flowing in the cooling water path 19. Particularly, the three heat releasing components (the cooling water path 19, the metal base plate 11, and the lower case 16) housed in the apparatus casing 12 makes a large contribution to the improvement of the heat releasing performance and both thinning and compaction of the apparatus 200.

Figure 18:
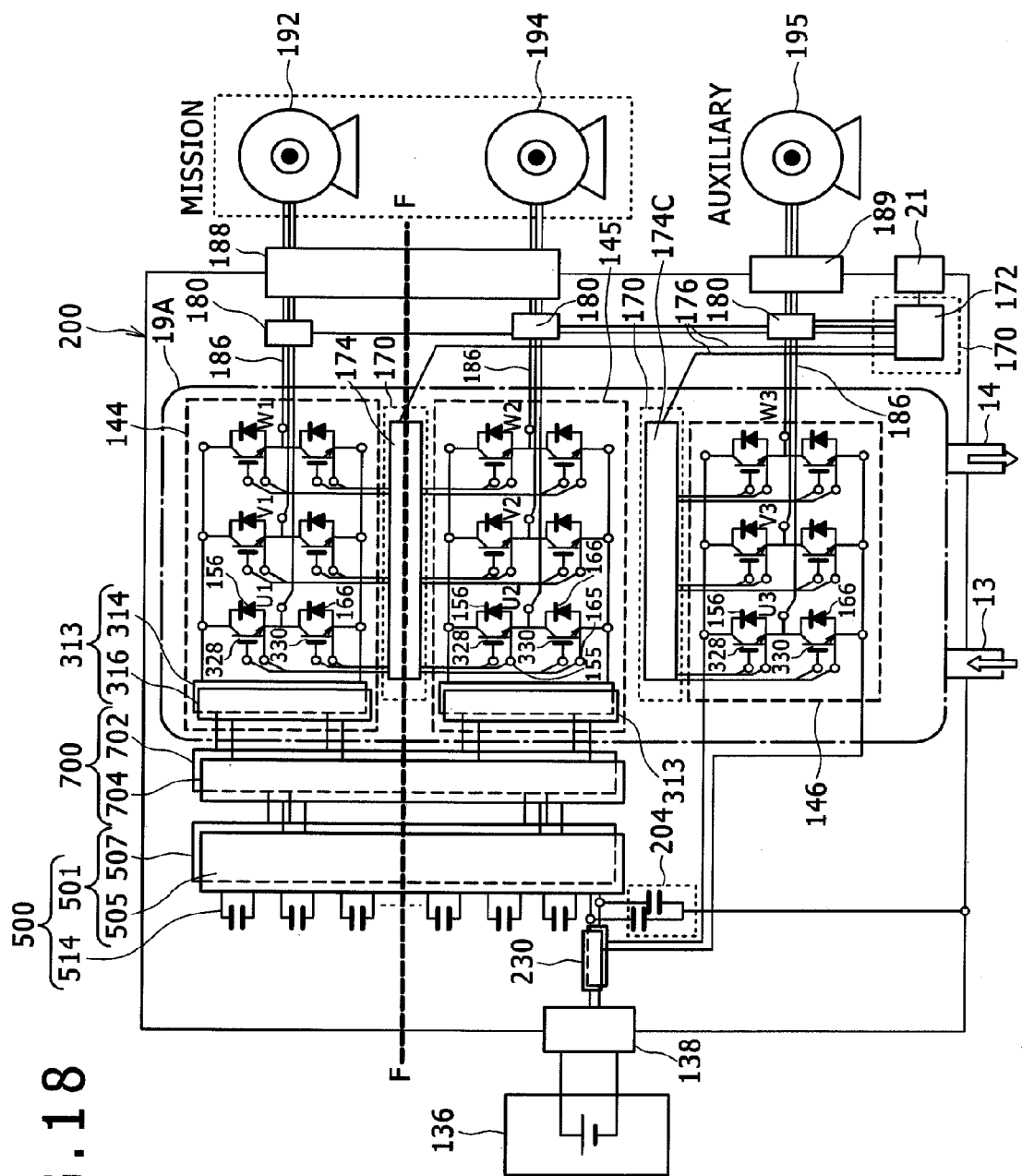
FIG. 18 is a variation of the circuit diagram of the power conversion apparatus 200.

FIG. 18 is a circuit diagram of the power conversion apparatus 200 in a variation of the embodiment described above. This circuit diagram is the same as that shown in FIG. 2. In FIG. 18, however, the disposition of the inverter circuits 144 and 145 of the power module 300 is changed from that shown in FIG. 2. In the example shown in FIG. 2, the semiconductor switch devices (consisting of the IGBT 328 and the diode 156 respectively) disposed closer to the upper arms are in the going flow of the cooling water path 19 and the semiconductor switch devices (consisting of the IGBT 330 and the diode 166 respectively) disposed closer to the lower arms are in the returning flow of the cooling water path 19. On the other hand, in the example shown in FIG. 18, the semiconductor switch devices of the inverter circuits 144 and 145 are turned by 90 degree. from those shown in FIG. 2. 189 denotes the AC connector (shown in FIG. 15) connecting the motor 195.

Figure 19:
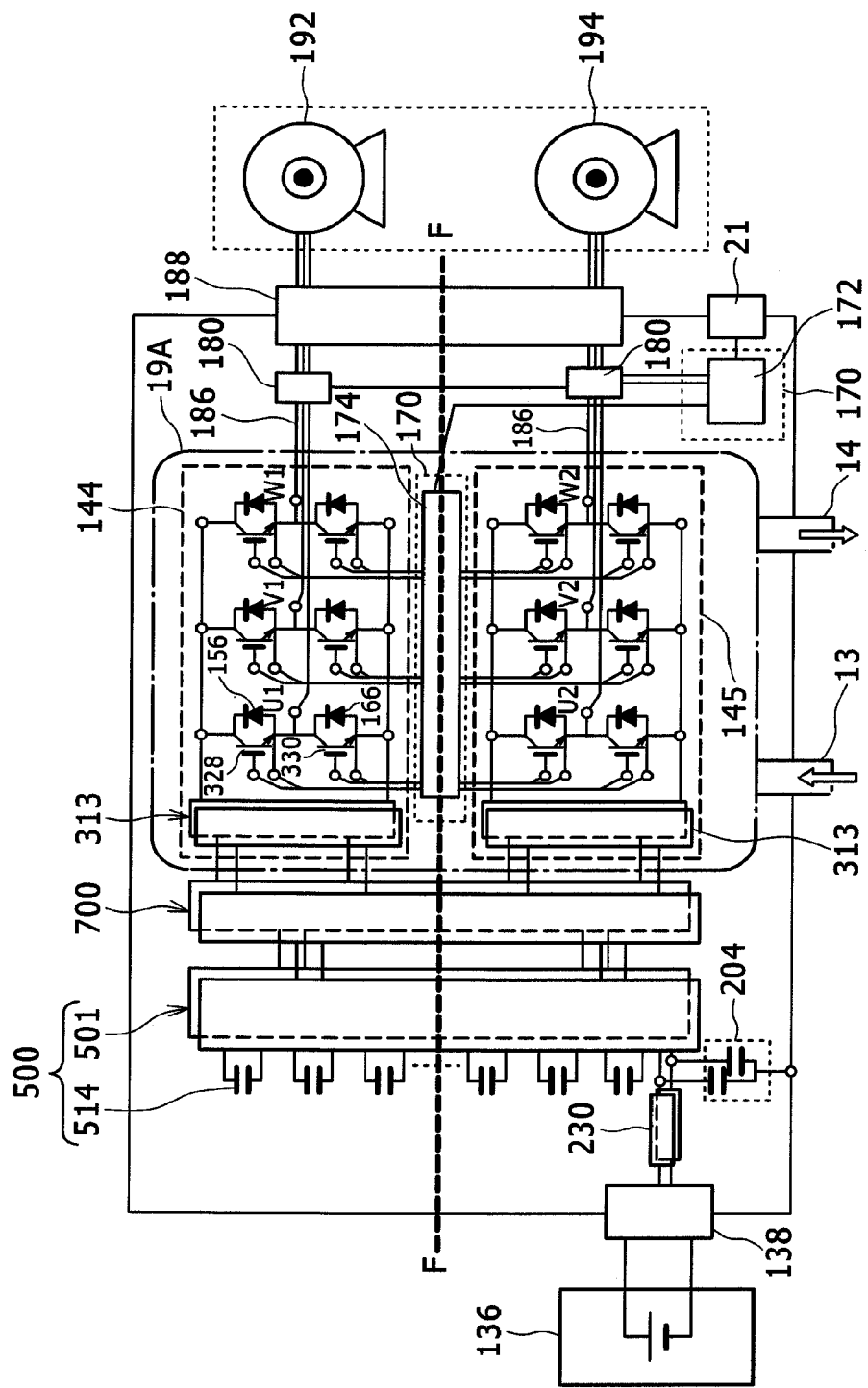
FIG. 19 is another variation of the circuit diagram of the power conversion apparatus 200, in which inverter devices 140 and 142 are added in the apparatus casing.

FIG. 19 is a circuit diagram of the inverter devices 140 and 142 housed in the apparatus casing 12. The inverter devices 140 and 142 that drive and control the motor generators 192 and 194 used for driving the subject vehicle generate more heat than the auxiliary inverter device 43 respectively, so that they are provided in the apparatus casing 12 in which the cooling jacket 19A is provided. On the other hand, the inverter device 43 that generates less heat is disposed outside the apparatus casing 12 (not shown). Even in this case, as shown in FIG. 2, the upper arm side semiconductor switch devices (consisting of the IGBT 328 and the diode 156 respectively) can be disposed in the going flow of the cooling water path 19 and the lower arm side semiconductor switch devices (consisting of the IGBT 330 and the diode 156 respectively) can be disposed in the returning flow of the cooling water path 19.

Figure 20:
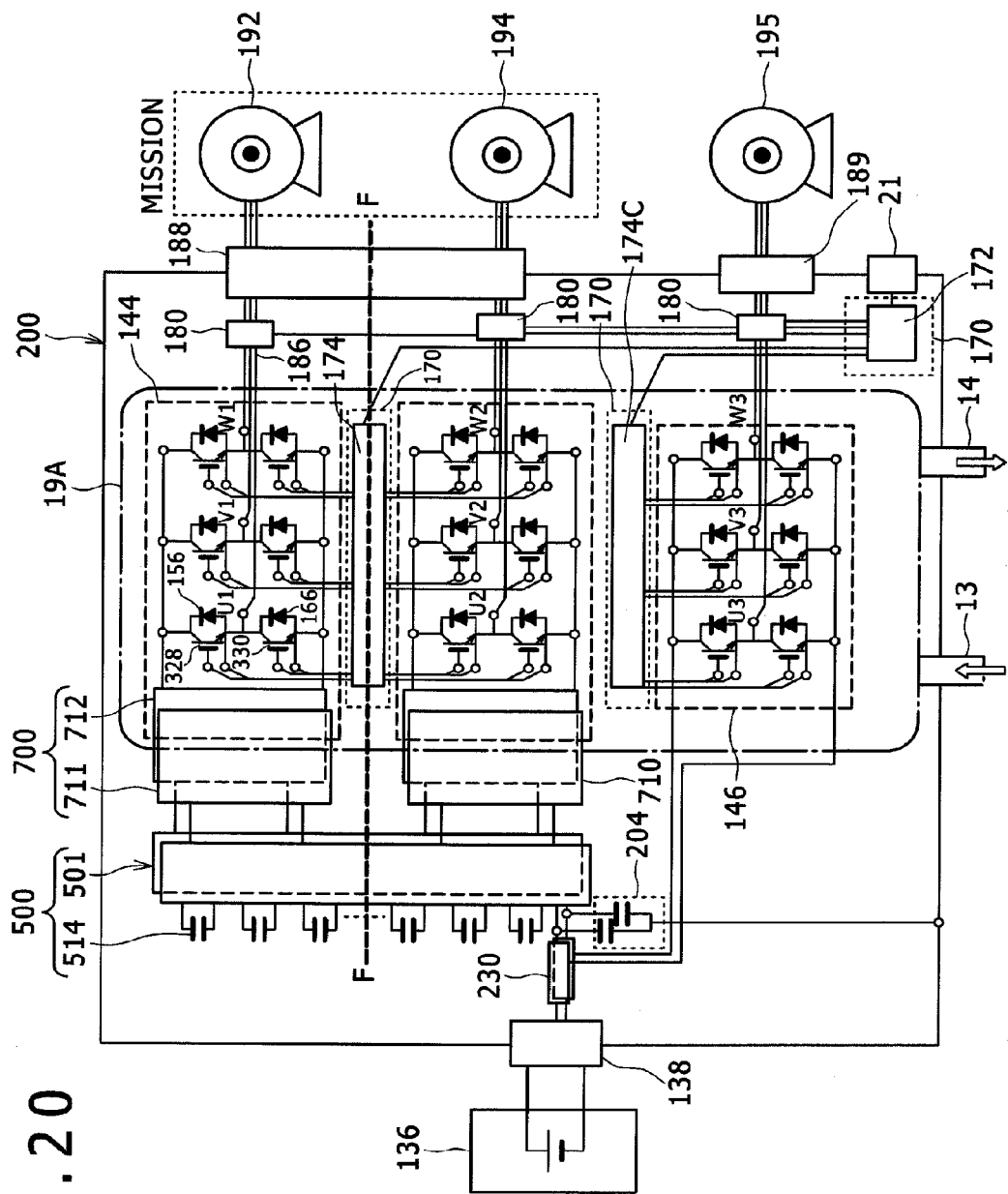
FIG. 20 is still another variation of the power conversion apparatus 200, in which two laminated conductor boards 710 are used.
Figure 21:
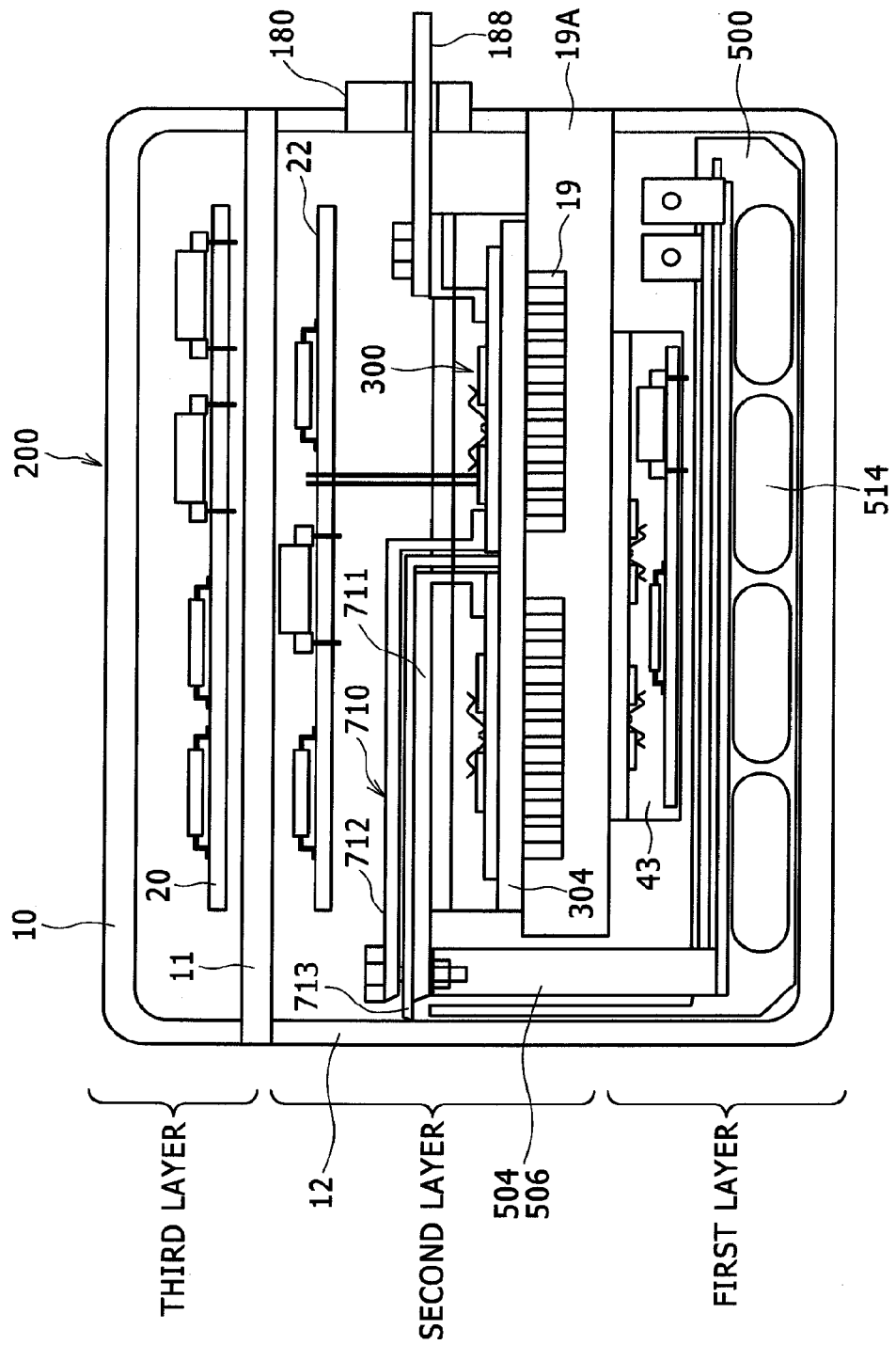
FIG. 21 is a cross sectional view taken on line F-F of FIG. 20.

FIG. 20 is a circuit diagram of the configuration shown in a variation of the configuration shown in FIG. 18; the form of the laminated wiring board in FIG. 18 is changed in FIG. 20. FIG. 21 is a cross sectional view of the power conversion apparatus 200 in the variation shown in FIG. 20; the cross sectional view is taken from the same direction as that in FIG. 17. This variation can also apply to the configuration shown in FIG. 2. In FIG. 18, the laminated conductor board 700 is connected to the laminated wiring board 501 of the capacitor module 500 and a DC terminal 313 built in the power module 300 is connected to the laminated conductor board 700. On the other hand, in the example shown in FIG. 20, the laminated conductor board 700 is divided into two laminated conductor boards 710 and each of the divided laminated conductor boards 710 is built in each power module 300. 189 denotes the AC connector (shown in FIG. 15) connecting the motor 195.

Each of the laminated conductor boards 710 includes positive and negative polarity conductor boards 711 and 712 disposed with an insulation sheet 713 therebetween. How to connect the laminated conductor boards 710 to the capacitor terminals 504 and 506 is the same as that of the laminated conductor board 700. The laminated conductor boards 710 fastened almost at right angles to the capacitor terminals 504 and 506 respectively are bent at a right angle at a middle point between the upper and lower arms so as to be led into the power module 300 and connected to a circuit wiring pattern 334k (see FIGS. 9A and 9B) of the power module 300. The upper and lower arms serial circuits of the power module 300 are connected in parallel between the positive and negative polarity conductor boards 711 and 712.

In the example shown in FIG. 18, the laminated conductor board 700 must be connected to the wiring parts (DC positive and negative polarity terminal connection parts 314a and 316a) built in the power module 300 with bolts or the like as shown in FIG. 17. On the other hand, in the example shown in FIG. 21, the positive and negative polarity conductor boards 711 and 712 of the laminated conductor board 700 are connected directly to the terminals of the power module 300. Therefore, the number of parts can be reduced and the assembling work efficiency is improved. Even in the example shown in FIG. 20, the laminated wiring boards 501 and the laminated conductor boards 710 are formed symmetrically with respect to the F-F cross section, so that the impedance can be reduced with respect to the parallel-disposed two power modules 300.

Figure 22:
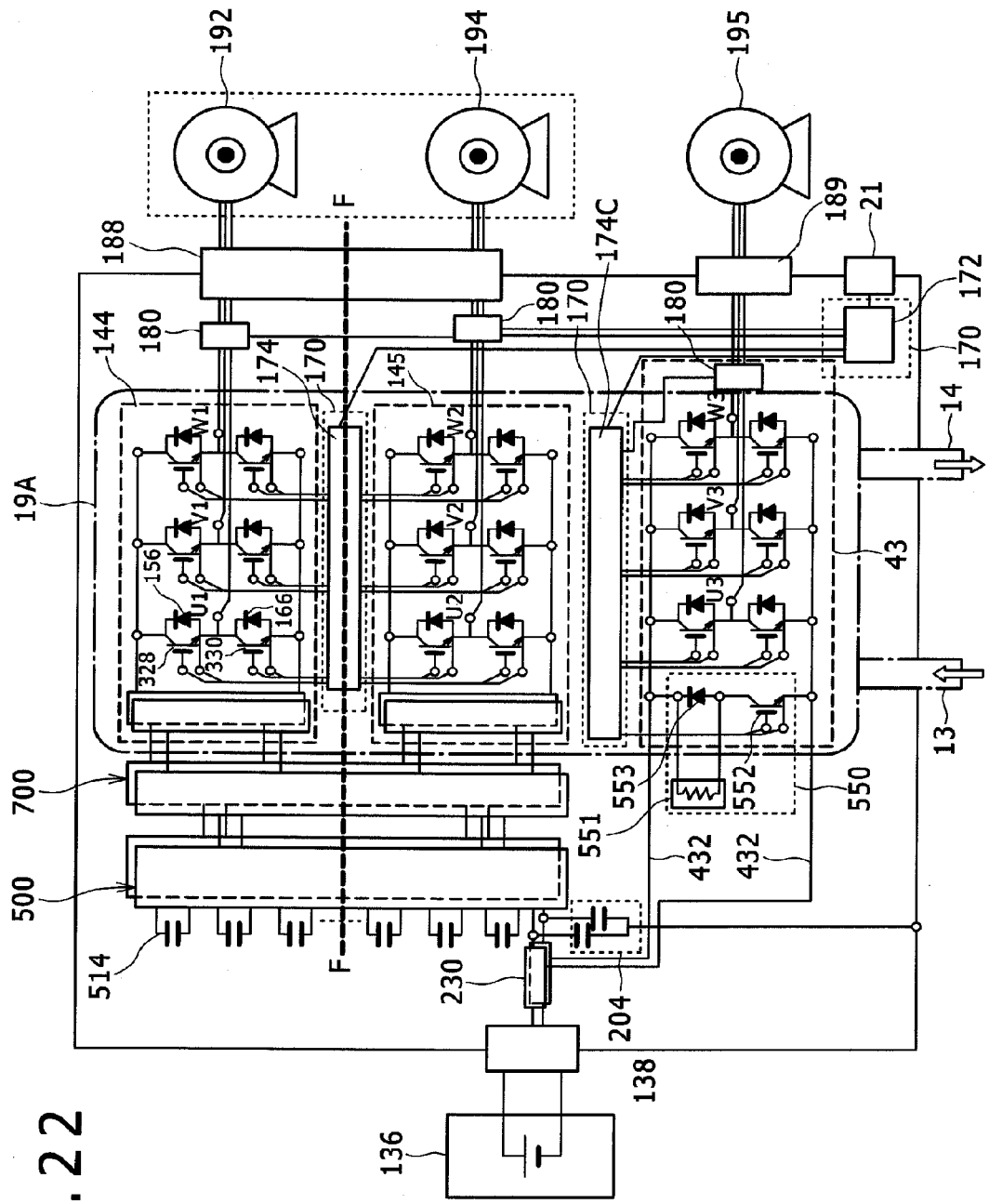
FIG. 22 is a still another variation of the power conversion apparatus 200, to which a discharging circuit 550 is added.

In the variation shown in FIG. 22, a discharging circuit 550 is added to the configuration shown in FIG. 18; the circuit 550 is used to discharge the energy of the capacitor module 500, which functions as a smoothing capacitor. The discharging circuit 550 is provided in the auxiliary inverter device 43 and connected between the positive pole part and the negative pole part of a power input line 432. The discharging circuit 550 also includes a discharging resistor 551 and a switching element 552 that are connected serially. A circulating diode 553 is connected in parallel to the discharging resistor 551. The switching element 552 and the diode 553 are built in the power module 300. They are, for example, mounted on the heat releasing base 431. On the other hand, the discharging resistor 551 is provided outside the power module 300 of the inverter device 43 and fastened to the bottom surface 191 of the cooling jacket 19A (e.g., the cover 420 that blocks the opening 404 formed at the bottom surface of the cooling jacket 19A). The switching element 552 is turned on/off under the control of the driver circuit 174C of the inverter device 43. The discharging resistor 551 may be provided in the inverter device 43 if possible.

Usually (while no discharging is made), the switching element 552 is turned off. When the ignition of the subject vehicle is turned off to discharge the capacitor module 500, the switching element 552 is turned on. This on-operation enables a current to flow into the discharging resistor 551, thereby the capacitor module 500 is discharged. The energy accumulated in the capacitor module 500 is converted to a thermal energy by the discharging resistor 551, then released into the cooling jacket 19A. This means that the power module cooling device (cooling jacket 19A) is also used as a cooling device of the discharging resistor 551. There is no need to provide a cooling device dedicated to the discharging resistor 551, so the apparatus 200 can be reduced in size. Furthermore, because the power input line 432 of the inverter device 43 is used, no discharging wiring is required. And although the discharging resistor 551 is fastened to the bottom surface of the cooling jacket 19A in the above example, the discharging resistor 551 may be provided in the power module 300 of the inverter device 43. This discharging circuit 550 can also apply to any of the configurations shown in FIGS. 2, 18 through 20. 189 denotes the AC connector (shown in FIG. 15) connecting the motor 195.

Figure 23:
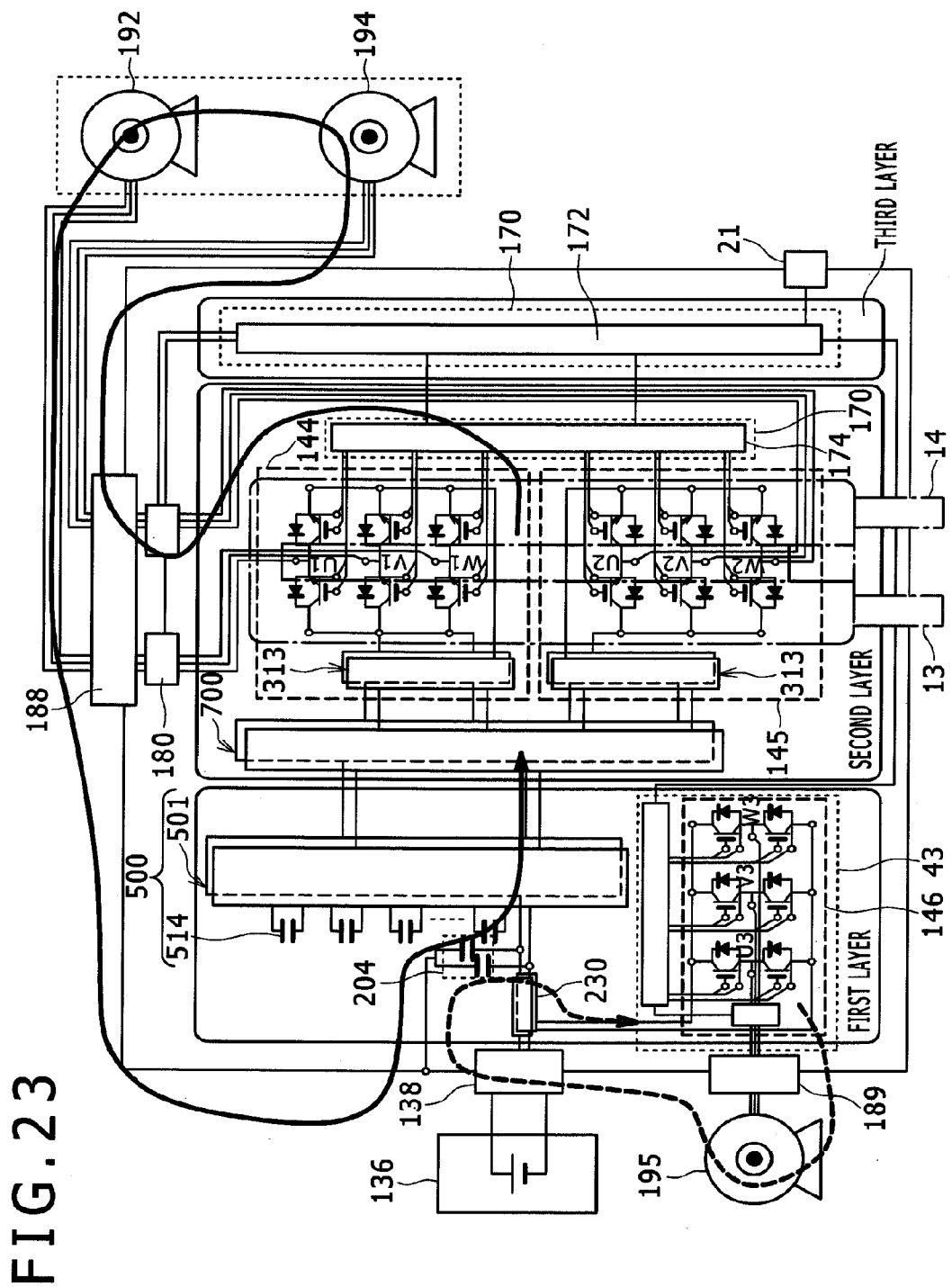
FIG. 23 is a circuit diagram of the power conversion apparatus 200 for describing how to separate a leak current route from a connection point of a noise filter 204.

FIG. 23 is a circuit diagram of a leak current preventive configuration in a variation. In case of the power conversion apparatus 200 shown in FIG. 23, an auxiliary machine (motor 195) AC connector 189 is provided on the first layer of the apparatus casing 12 so as to be separated from the main machine (motor generator 192/194) AC connector 188. The solid line with an arrow denotes a leak current flow route of the main machine and a dotted line with an arrow denotes a leak current flow route of the auxiliary machine.

In the configuration shown in FIG. 23, the DC line that connects the DC connector 138, which is a DC power input terminal, to the laminated wiring board 501 of the capacitor module 500 also makes a connection between the DC connector 138 to the power module 300 of the inverter device 43, then to the noise filter 204. Because each connection point is disposed in such a way, the main machine leak current flow route can be separated from the auxiliary machine leak current flow route. The main machine leak current flows from the connection point of the noise filter 204 of the apparatus casing 12 to the laminated wiring board 501 through the noise filter 204 as shown with the solid arrow line. On the other hand, the auxiliary machine leak current flows from the apparatus casing 12 to the power module 300 of the inverter device 43 through the noise filter 204 and the input laminated wiring board 230 as shown with a dotted arrow line.

The noise generated from the motor regenerators 192 and 194 used for driving the subject vehicle is larger than that of the auxiliary motor 195. Consequently, some measures should be taken to prevent superposing of the noise generated from the motor generators 192 and 104 on the input to the auxiliary inverter circuit 146. In this aspect, in the configuration shown in FIG. 23, such superposing (influence) of the noise of the motor generators 192 and 194 is prevented by the disposition of the noise filter 204 between the connection point of the laminated wiring board 501 and the connection point of the input line of the inverter device 43 and by the separation of the main machine leak current flow route from the auxiliary machine leak current flow route. As a result, noise reduction is also realized.

In FIGS. 2, 18, 19, 20, and 22, an F dotted line denotes a cross sectional line just like the F-F cross sectional line. In FIG. 23, the laminated wiring board 501 is slightly shifted upward with respect to the laminated conductor board 700 for the reasons of the illustration. However, just like in FIG. 2, the laminated wiring boards 501, the laminated conductor boards 700, and the DC terminals 313 are all disposed symmetrically with respect to the F-F cross sectional line.

According to the embodiment of the present invention as described above, therefore, the following effects will be assured.

(1) In the power conversion apparatus having two power modules disposed in parallel and provided with built-in inverter circuits respectively, the apparatus further includes a three-layer laminated wiring board 501 consisting of a positive polarity conductor board 507 and a negative polarity conductor board 505 formed widely in the direction of the parallel disposition of the power modules 300 and laminated with an insulation sheet 517 therebetween; a plurality of capacitors 514 connected in parallel between the positive polarity conductor board 507 and the negative polarity conductor board 505 of the laminated wiring board 501; a three-layer laminated conductor board 700 consisting of a positive polarity conductor board 702 and a negative polarity conductor board 704 formed widely in the direction of the parallel composition of the power modules 300 and laminated with an insulation sheet 704 therebetween, and used to connect the positive and negative polarity sides of each of the two power modules 300 to the laminated wiring board 501. In other words, as shown in FIGS. 2, and 11 through 13, each of the laminated wiring board 501 and the laminated conductor board 700 is formed by laminating a pair of conductor boards formed widely in the direction of the parallel disposition of the power modules 300 with such an insulation layer as an insulation sheet or the like therebetween, so that the inductance and the resistance in the routes from the plurality of capacitor cells 514 to the two power modules 300 can be reduced. In addition, because the plurality of capacitor cells 514 are connected in parallel to the laminated wiring board 501, the capacitor module can function as one large capacitor. As a result, the wiring impedance can be reduced. For example, the surge voltage at the switching time can be lowered. Furthermore, because the surge voltage can be lowered in such a way, the switching loss can be reduced, thereby the inverter circuit heat generation is reduced and the cooling system can be compacted. In addition, the operation lives of the switching semiconductor elements that might be otherwise shortened by excessive heat generation can be extended respectively. And because conductor boards formed widely in the direction of the parallel disposition of the power modules respectively are used to form a laminated wiring, the impedance can be set equally between the two power modules 300.

(2) Furthermore, the laminated wiring board 501 and the laminated conductor board 700 are shaped and disposed so that the impedance becomes almost equal among the routes from the plurality of capacitor cells 514 to the two power modules. For example, as shown in FIGS. 2, 16, and 18, the two power modules 300 are disposed in parallel and symmetrically to one plane (F-F cross section) and the laminated wiring board 501 and the laminated conductor board 700 are shaped and disposed symmetrically to the F-F cross section. Consequently, the distance and positional relationship between each of the plurality of capacitor cells 514 and each of the two power modules 300 become almost equal, thereby the impedance among the routes from the plurality of capacitor cells 514 to the two power modules 300 becomes almost equal. And because a DC power can be supplied from the capacitor module 500 to the two power modules that carry out high speed switching operations through wirings having almost equal impedance respectively, the withstand voltage and loss of semiconductor elements can be set almost equally between the two power modules 300. For example, if the withstand voltage and loss are different between those two power modules 300, a withstand voltage device is required in accordance with the difference level. Otherwise, the two power modules 300 cannot output the same current. In addition, the operation lives of the switching elements come to differ significantly between those two power modules 300. These have been conventional problems. The power conversion apparatus in this embodiment of the prevent invention can solve such problems by disposing and shaping such components as the power modules 300, the laminated wiring board 501, and the laminated conductor board 700 so as to assure almost the same impedance for the wirings. The present invention also enables the same parts to be used for the two power modules, thereby the manufacturing cost of the apparatus can be reduced.

(3) As shown in FIGS. 2, 16, and 17, because the apparatus 200 includes the cooling jack 19A so as to directly cool down the metal base 304 having the upper arm side semiconductor switch device (consisting of the IGBT 328 and the diode 156) and the lower arm side semiconductor switch device (consisting of the IGBT 330 and the diode 166) with the cooling water flowing vertically to the F-F cross section, the power modules 300 can be cooled down effectively. In the embodiment described above, the cooling water path 19 is shaped like the U-letter. However, the path 19 may be shaped so that the water supplied from an inlet is drained from an outlet linearly. In such a case, the power modules 300 are disposed on the water path 19 side by side linearly; therefore, the shape of the water path 19 can be simplified.

(4) And as shown in FIG. 2, because the heat releasing base 304 is fastened to a surface 410S so as to stride both going and returning pipes of the cool water path 19, the cooling efficiency can be made in uniform between the two power modules 300. On the surface 410S are formed the going pipe 19 in which the cooling water flows from the inlet (inlet pipe 13) vertically to the F-F cross section and the returning pipe 19 in which the cooling water flows reversely toward the outlet (outlet pipe 14), thereby the going and returning water flows come to be shaped like the M-letter. This means that the inlet/outlet side power module 300 is cooled down with water supplied from the inlet pipe 13 and with water slightly warmed by the heat from heat generation components disposed around the outlet pipe 14. On the other hand, the returning side power module 300 is cooled down with slightly warmed water and with water slightly cooler than the water around the outlet hole 403. As a result, the disposition relationship between the returning water flow and the two power modules 300 comes to assure a merit that the cooling efficiency is balanced well between those two power modules 300. And almost the same temperature is kept at both of the two power modules 300 and this is very effect to prevent the operation lives of the apparatus components from significant difference from each another.

(5) Furthermore, as shown in FIG. 2, it may be possible that the upper arm side IGBT 328 and diode 156 are cooled down by the going water while the lower arm side IGBT 330 and diode 166 are cooled down by the returning water in the cooling water path 19.

(6) As shown in FIGS. 6 and 15, because the AC connector, which is an output terminal of each power module 300, is disposed in the direction of the module side surface, which is orthogonal to the direction of the parallel disposition of the two power modules 300, the wiring workability is improved.

(7) As shown in FIGS. 16 and 17, the plurality of capacitor cells 514 and the laminated wiring board 501 are disposed so as to face the bottom surface 191 of the cooling jacket 19A, which is an opposite side of the surface 410A on which the cooling water path 19 is formed and the laminated conductor board 700 is disposed so as to face the two power modules 300, so that the distance between the capacitor module and the cooling jacket 19A is shortened. For example, if the apparatus casing 12 is used as a cooling path, the capacitor module can be cooled down effectively. Furthermore, because part (the capacitor terminals 504 and 506) of the laminated wiring board 501 is extended up to a side surface of the cooling jacket 19A and connected to the laminated conductor board 700, the connection between the laminated wiring board 501 and the laminated conductor board 700 can be made easily, thereby the workability can be improved.

(8) Furthermore, part (the capacitor terminals 504 and 506) of the laminated wiring board 501 is extended up to the laminated conductor board 700 disposed so as to face the two power modules 300, so that the workability is more improved.

(9) As shown in FIGS. 16 and 17, the power module 43 that includes the built-in 3-phase output type inverter circuit 146 is disposed so that its metal base 431 is fastened to the bottom surface 191 of the cooling jacket 19A. As a result, the bottom surface 191 of the cooling jacket 19A can be used as an effective cooling surface, thereby the cooling system can be reduced in size and the number of the cooling system components can be reduced. The power conversion apparatus 200 itself can thus be reduced in size.

(10) As shown in FIG. 22, the power module 43 incorporates part of the discharging circuit 550 that discharges the electricity accumulated in the plurality of capacitor cells 514, so that the apparatus 200 can be reduced in size. In addition, the discharging circuit 550 is cooled down by the cooling jacket 19A and the discharging performance can be improved. Furthermore, the discharging circuit 550 is connected in parallel to the positive polarity side semiconductor switch device (consisting of the IGBT 328 and the diode 156) and the negative polarity side semiconductor switch device (consisting of the IGBT 330 and the diode 166) of the power module 43, that is, because the power input line 432 of the power module 43 is used, the discharging circuit 550 can be eliminated.

(11) As shown in FIG. 23, the connection points of the pair of capacitors (used for the noise filter 204) are provided on each DC power line between the DC power input connector 138 of the power conversion apparatus 200 and the laminated wiring board 501 sequentially from the DC connector 138 side. The pair of capacitors is used to connect the input line connection point of the auxiliary power module 43 to the ground terminal of the power converter apparatus 200. Because the pair of capacitors used for eliminating noise is connected at such positions, the leak current routes of the motor generators 192 and 194 can be separated from that of the auxiliary motor 195, thereby the noise from the motor generators 192 and 194 can be prevented from superposing on the noise from the motor 195. As a result, noise generation is suppressed in the apparatus 200.

This embodiment can also be combined with any one or more variations described above in any form.

While the preferred forms of the present invention have been described, it is, to be understood that modifications will be apparent to those skilled in the art without departing from the spirit of the invention. For example, although the inverter device 43 and the inverter circuit of each power module 300 are all provided as 3-phase output ones in the embodiment described above, they may not be limited only to them.

The invention claimed is:

1. A power conversion apparatus comprising:
    a first power module comprising a built-in inverter circuit that includes a positive polarity side semiconductor switch unit and a negative polarity side semiconductor switch unit for each phase;
    a second power module comprising a built-in inverter circuit that includes a positive polarity side semiconductor switch unit and a negative polarity side semiconductor switch unit for each phase;
    a plurality of capacitors;
    a first wiring board connected to the plurality of capacitors;
    a plurality of capacitor terminals connected to the first wiring board; and
    a second wiring board having a three-layer laminated structure comprising a positive polarity conductor board and a negative polarity conductor board formed in a direction parallel to a direction in which the first and second power modules are arranged and laminated with an insulation layer between the positive polarity conductor board and the negative polarity conductor board; wherein
    the plurality of capacitor terminals includes a first capacitor terminal and a second capacitor terminal,
    the first capacitor terminal is located closer to the first power module than the second power module,
    the first capacitor terminal is connected to the second wiring board,
    the second capacitor terminal is located closer to the second power module than the first power module, and
    the second capacitor terminal is connected to the second wiring board.

2. The power conversion apparatus according to claim 1, wherein
    the first capacitor terminal, the second capacitor terminal and the second wiring board are disposed so that impedances along routes from the plurality of capacitors to the first and second power modules are substantially equal.

3. The power conversion apparatus according to claim 1, wherein
    the first power module and the second power module are disposed symmetrically with respect to one plane; and
    the first wiring board is shaped symmetrically with respect to the plane so that impedances along routes from the plurality of capacitors to the first power module and the second power module are substantially equal.

4. The power conversion apparatus according to claim 1, further comprising:
    a cooling jacket having a cooling path in which a coolant flows; wherein
    the first power module and the second power module adjacent to one another are located on the cooling jacket;
    the plurality of capacitors and the first wiring board are located at an opposite side of the cooling jacket from the first power module and the second power module; and
    the plurality of capacitor terminals extend to a side of the cooling jacket.

5. The power conversion apparatus according to claim 1, further comprising:
    a cooling jacket having a cooling path in which a coolant flows; and
    a casing housing the cooling jacket, the first power module, the second power module, the first wiring board, the plurality of capacitors, and the second wiring board; wherein
    the cooling jacket divides an inside of the casing into a first region and a second region;
    the first wiring board and the plurality of capacitors are located in the first region;
    the first power module, the second power module and the second wiring board are located in the second region.

* * * * *